(12) United States Patent
Weidman

(10) Patent No.: US 7,438,949 B2
(45) Date of Patent: Oct. 21, 2008

(54) RUTHENIUM CONTAINING LAYER DEPOSITION METHOD

(75) Inventor: Timothy W. Weidman, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 252 days.

(21) Appl. No.: 11/228,649

(22) Filed: Sep. 15, 2005

(65) Prior Publication Data

US 2006/0165892 A1      Jul. 27, 2006

Related U.S. Application Data

(60) Provisional application No. 60/648,004, filed on Jan. 27, 2005, provisional application No. 60/715,024, filed on Sep. 8, 2005.

(51) Int. Cl.
*C23C 16/06* (2006.01)
(52) U.S. Cl. .................................. 427/250; 427/255.31
(58) Field of Classification Search .............. 427/248.1, 427/250
See application file for complete search history.

(56) References Cited

U.S. PATENT DOCUMENTS

| | | | |
|---|---|---|---|
| 5,248,496 A * | 9/1993 | Schuster et al. ............... | 423/22 |
| 5,415,890 A | 5/1995 | Kloiber et al. | |
| 5,554,226 A | 9/1996 | Okase et al. | |
| 5,614,003 A | 3/1997 | Mallory, Jr. | |
| 5,733,816 A | 3/1998 | Iyer et al. | |
| 5,830,805 A | 11/1998 | Shacham-Diamand et al. | |
| 5,885,749 A | 3/1999 | Huggins et al. | |

(Continued)

OTHER PUBLICATIONS

Sankar et al, Low temperature chemical vapour deposition of ruthenium and ruthenium dioxide on polymer surfaces, J. Mater. Chem. 1999, p. 2439-2444.*

(Continued)

*Primary Examiner*—Timothy Meeks
*Assistant Examiner*—Elizabeth A Burkhart
(74) *Attorney, Agent, or Firm*—Patterson & Sheridan, LLP

(57) ABSTRACT

An exemplary apparatus and method of forming a ruthenium tetroxide containing gas to form a ruthenium containing layer on a surface of a substrate is described herein. The method and apparatus described herein may be especially useful for fabricating electronic devices that are formed on a surface of the substrate or wafer. Generally, the method includes exposing a surface of a substrate to a ruthenium tetroxide vapor to form a catalytic layer on the surface of a substrate and then filling the device structures by an electroless, electroplating, physical vapor deposition (PVD), chemical vapor deposition (CVD), plasma enhanced CVD (PECVD), atomic layer deposition (ALD) or plasma enhanced ALD (PE-ALD) processes. In one embodiment, the ruthenium containing layer is formed on a surface of a substrate by creating ruthenium tetroxide in an external vessel and then delivering the generated ruthenium tetroxide gas to a surface of a temperature controlled substrate positioned in a processing chamber. In one embodiment, a ruthenium tetroxide containing solvent formation process is used to form ruthenium tetroxide using a ruthenium tetroxide containing source material. In one embodiment, of a ruthenium containing layer is formed on a surface of a substrate, using the ruthenium tetroxide containing solvent. In another embodiment, the solvent is separated from the ruthenium tetroxide containing solvent mixture and the remaining ruthenium tetroxide is used to form a ruthenium containing layer on the surface of a substrate.

21 Claims, 15 Drawing Sheets

U.S. PATENT DOCUMENTS

| | | | |
|---|---|---|---|
| 6,036,741 A | 3/2000 | Shindo et al. | |
| 6,065,424 A | 5/2000 | Shacham-Diamand et al. | |
| 6,091,099 A | 7/2000 | Kiyotoshi et al. | |
| 6,100,184 A | 8/2000 | Zhao et al. | |
| 6,103,393 A | 8/2000 | Kodas et al. | |
| 6,107,199 A | 8/2000 | Allen et al. | |
| 6,110,530 A | 8/2000 | Chen et al. | |
| 6,153,935 A | 11/2000 | Edelstein et al. | |
| 6,155,540 A | 12/2000 | Takamatsu et al. | |
| 6,165,912 A | 12/2000 | McConnell et al. | |
| 6,171,661 B1 | 1/2001 | Zheng et al. | |
| 6,197,181 B1 | 3/2001 | Chen | |
| 6,197,688 B1 | 3/2001 | Simpson | |
| 6,242,349 B1 | 6/2001 | Nogami et al. | |
| 6,245,670 B1 | 6/2001 | Cheung et al. | |
| 6,258,270 B1 | 7/2001 | Hilgendorff et al. | |
| 6,258,707 B1 | 7/2001 | Uzoh | |
| 6,277,263 B1 | 8/2001 | Chen | |
| 6,342,733 B1 | 1/2002 | Hu et al. | |
| 6,344,410 B1 | 2/2002 | Lopatin et al. | |
| 6,428,673 B1 | 8/2002 | Ritzdorf et al. | |
| 6,431,190 B1 | 8/2002 | Oka et al. | |
| 6,436,267 B1 | 8/2002 | Carl et al. | |
| 6,441,492 B1 | 8/2002 | Cunningham | |
| 6,451,665 B1 | 9/2002 | Yunogami et al. | |
| 6,458,183 B1 * | 10/2002 | Phillips et al. | 75/631 |
| 6,503,834 B1 | 1/2003 | Chen et al. | |
| 6,517,894 B1 | 2/2003 | Hongo et al. | |
| 6,528,409 B1 | 3/2003 | Lopatin et al. | |
| 6,537,461 B1 | 3/2003 | Nakahara et al. | |
| 6,573,606 B2 | 6/2003 | Sambucetti et al. | |
| 6,586,161 B2 | 7/2003 | Futase et al. | |
| 6,588,437 B1 | 7/2003 | Higashi | |
| 6,605,874 B2 | 8/2003 | Leu et al. | |
| 6,607,988 B2 | 8/2003 | Yunogami et al. | |
| 6,649,211 B2 * | 11/2003 | Lyons et al. | 427/126.5 |
| 6,709,563 B2 | 3/2004 | Nagai et al. | |
| 6,737,221 B2 | 5/2004 | Futase et al. | |
| 6,743,473 B1 | 6/2004 | Parkhe et al. | |
| 6,753,133 B2 | 6/2004 | Ono et al. | |
| 6,756,682 B2 | 6/2004 | Sinha et al. | |
| 6,787,450 B2 | 9/2004 | Morgan et al. | |
| 6,800,542 B2 | 10/2004 | Kim | |
| 6,852,635 B2 | 2/2005 | Satta et al. | |
| 2002/0176927 A1 | 11/2002 | Kodas et al. | |
| 2002/0184969 A1 | 12/2002 | Kodas et al. | |
| 2003/0075808 A1 | 4/2003 | Inoue et al. | |
| 2003/0207214 A1 | 11/2003 | Futase et al. | |
| 2003/0232511 A1 | 12/2003 | Metzner et al. | |
| 2004/0013799 A1 * | 1/2004 | Kim et al. | 427/248.1 |
| 2004/0113277 A1 | 6/2004 | Chiras et al. | |
| 2004/0265501 A1 | 12/2004 | Choi et al. | |
| 2005/0009346 A1 | 1/2005 | Miyajima | |
| 2005/0081787 A1 | 4/2005 | Im et al. | |
| 2005/0089748 A1 | 4/2005 | Ohlsen et al. | |
| 2005/0238808 A1 | 10/2005 | Gatineau et al. | |
| 2005/0252449 A1 | 11/2005 | Nguyen et al. | |
| 2006/0102078 A1 | 5/2006 | Fairbairn et al. | |
| 2006/0115590 A1 | 6/2006 | Suzuki et al. | |

OTHER PUBLICATIONS

Peck et al, Chemical vapor deposition of novel precursors for advanced capacitor electrodes, PraxAir, Inc.*

Hoover, Cynthia A., et al. "Advanced Ruthenium Precursors for Thin Film Deposition" Praxair Electronics Publication.

Shacham-Diamand, Yosi, et al. "Integrated Electroless Metallization for ULSI" Electrochimica Acta 44 (1999) 3639-3649.

Over, H. "Ruthenium Dioxide, a Fascinating Material for Atomic Scale Surface Chemistry" Appl. Phys. A 75 (2002), 37-44.

Sankar, Jayasree, et al. "Low Temperature Chemical Vapour Deposition of Ruthenium and Ruthenium Dioxide on Polymer Surfaces" Journal of Materials Chemistry 9 (1999), 2439-2444.

Peck, John, et al. "Chemical Vapor Deposition of Novel Precursors for Advanced Capacitor Electrodes" Praxair Electronics Publication.

Swider-Lyons, et al. "Selective Vapor Deposition of Hydrous $RuO_2$ Thin Films", Journal of The Electrochemcial Society, 152-3 (2005) C158-C162.

Shih, C.H., et al. "Direct Plating of Cu on ALD TaN for 45nm-node Cu BEOL Metallization". IEEE, 2004.

Colomer, et al., "Structural, Microstructural, and Electrical Transport Properties of $TiO_2$—$RuO_2$ Ceramic Materials Obtained by Polymeric Sol-Gel Route," Chem. Mater. 2000, 12, pp. 923-930.

Hoover, Cynthia A., et al. "Advanced Ruthanium Precursors for Thin Film Deposition" Praxair Electronics Publication. "No Date".

Shacham-Diamand, Yosi, et al. "Integrated Electroless Metallization for ULSI" Electrochimica Acta 44 (1999) 3639-3649.

Over, H. "Ruthenium Dioxide, a Fascinating Material for Atomic Scale Surface Chemistry" Appl. Phys. A 75 (2002), 37-44.

Sankar, Jayasree, et al. "Low Temperature Chemical Vapour Deposition of Ruthenium and Ruthenium Dioxide on Polymer Surfaces" Journal of Materials Chemistry 9 (1999), 2439-2444.

Peck, John, et al. "Chemical Vapor Deposition of Novel Precursors for Advanced Capacitor Electrodes" Praxair Electronics Publication.

Swider-Lyons, et al. "Selective Vapor Deposition of Hydrous $RuO_2$ Thin Films", Journal of The Electrochemical Society, 152-3 (2005) C158-C162.

Shih, C.H., et al. "Direct Plating of Cu on ALD TaN for 45nm-node Cu BEOL Metalization", IEEE, 2004.

* cited by examiner

RUTHENIUM CONTAINING LAYER DEPOSITION METHOD

CROSS-REFERENCE TO RELATED APPLICATIONS

This application claims the benefit of U.S. Provisional Patent Application Ser. No. 60/648,004, filed Jan. 27, 2005 and U.S. Provisional Patent Application No. 60/715,024, filed Sep. 8, 2005, which are both herein incorporated by reference.

BACKGROUND OF THE INVENTION

1. Field of the Invention

Embodiments of the invention generally relate to methods for depositing a catalytic layer on a barrier layer, prior to depositing a conductive layer thereon.

2. Description of the Related Art

Multilevel, 45 nm node metallization is one of the key technologies for the next generation of very large scale integration (VLSI). The multilevel interconnects that lie at the heart of this technology possess high aspect ratio features, including contacts, vias, lines and other apertures. Reliable formation of these features is very important for the success of VLSI and the continued effort to increase quality and circuit density on individual substrates. Therefore, there is a great amount of ongoing effort being directed to the formation of void-free features having high aspect ratios of 10:1 (height: width) or greater.

Copper is a choice metal for filling VLSI features, such as sub-micron high aspect ratio, interconnect features. Contacts are formed by depositing a conductive interconnect material, such as copper into an opening (e.g., via) on the surface of insulating material disposed between two spaced-apart conductive layers. A high aspect ratio of such an opening may inhibit deposition of the conductive interconnect material that demonstrates satisfactory step coverage and gap-fill. Although copper is a popular interconnect material, copper suffers by diffusing into neighboring layers, such as dielectric layers. The resulting and undesirable presence of copper causes dielectric layers to become conductive and electronic devices to fail. Therefore, barrier materials are used to control copper diffusion.

A typical sequence for forming an interconnect includes depositing one or more non-conductive layers, etching at least one of the layer(s) to form one or more features therein, depositing a barrier layer in the feature(s), and depositing one or more conductive layers, such as copper, to fill the feature. The barrier layer typically includes a refractory metal nitride and/or silicide, such as titanium or tantalum. Of this group, tantalum nitride is one of the most desirable materials for use as a barrier layer. Tantalum nitride provides a good barrier to copper diffusion, even when relatively thin layers are formed (e.g., 20 Å or less). A tantalum nitride layer is typically deposited by conventional deposition techniques, such as physical vapor deposition (PVD), atomic layer deposition (ALD), and chemical vapor deposition (CVD).

Tantalum nitride does have some negative characteristics, which include poor adhesion to the copper layer deposited thereon. Poor adhesion of the subsequent deposited copper layer(s) can lead to rapid electromigration in the formed device and possibly process contamination issues in subsequent processing steps, such as, chemical mechanical polishing (CMP). It is believed that exposure of the tantalum nitride layer to sources of oxygen and/or water can result in oxidation thus preventing the formation of a strong bond with the subsequently deposited copper layer. The interface between a tantalum nitride barrier layer and a copper layer is likely to separate during a standard tape test.

Typical deposition processes utilize precursors that contain carbon which becomes incorporated in the deposited barrier layer. The carbon incorporation is often detrimental to the completion of wet chemical processes since the deposited film tends to be hydrophobic which reduces or prevents the fluid from wetting and depositing a layer having desirable properties. To solve this problem, oxidizing processes are often used on barrier layers to remove the incorporated carbon, but these processes can have a detrimental effect on the other exposed and highly oxidizable layers, such as, copper interconnects. Therefore, a process and apparatus is needed that is able to deposit a barrier layer or adhesion layer that is able to enhance bonding adhesion between the various layers, such as Tantalum nitride (TaN) and copper. Also, in some cases a process and apparatus is needed to form an adhesion layer which can be directly deposited on dielectric, non-metallic or other desirable materials.

Therefore, a need exists for a method to deposit a copper-containing layer on a barrier layer with good step coverage, strong adhesion and low electrical resistance within a high aspect ratio interconnect feature.

SUMMARY OF THE INVENTION

The present invention generally provides a method of forming a ruthenium containing layer on a substrate surface, comprising the steps of: forming a ruthenium tetroxide in a first vessel, delivering an amount of the ruthenium tetroxide contained in the first vessel to a second vessel, purging the second vessel after the amount of the ruthenium tetroxide has been delivered to the second vessel from the first vessel and delivering an amount of ruthenium tetroxide contained in the second vessel to a substrate positioned on a substrate support in a vacuum processing chamber.

Embodiments of the invention may further provide a method of forming a ruthenium containing layer on a substrate surface, comprising the steps of: forming a ruthenium tetroxide containing gas in a first vessel, delivering an amount of the ruthenium tetroxide containing gas from the first vessel to a second vessel, collecting a desired amount of ruthenium tetroxide from the ruthenium tetroxide containing gas on a surface of the second vessel that is maintained at a first temperature, purging the second vessel to remove unwanted contaminants contained in the second vessel, vaporizing an amount of the ruthenium tetroxide found on the surface of the second vessel, and delivering an amount of the vaporized ruthenium tetroxide from the second vessel to a substrate positioned on a substrate support in a processing chamber to form a ruthenium containing layer on a surface of the substrate.

Embodiments of the invention may further provide a method of forming a ruthenium containing layer on a substrate surface, comprising the steps of: providing a solvent mixture that comprises a solvent and ruthenium tetroxide and delivering the solvent mixture to a substrate positioned on a substrate support in a processing chamber.

Embodiments of the invention may further provide a method of forming a ruthenium containing layer on a substrate surface, comprising the steps of: providing an aqueous solution that comprises a perruthenate material, water and a hypochlorite containing material, adding an amount of an acid to the aqueous solution, adding a solvent to the aqueous solution to form a solvent containing mixture, removing the water from the solvent containing mixture, separating the ruthenium tetroxide from the solvent containing mixture, and delivering the ruthenium tetroxide to a substrate positioned on a substrate support in a processing chamber.

Embodiments of the invention may further provide a method of forming a ruthenium containing layer on a substrate surface, comprising the steps of: providing an aqueous solution that comprises a perruthenate material, water and a hypochlorite containing material, adding an amount of an acid to the aqueous solution, adding a solvent to the aqueous solution, delivering an amount of the solvent mixture to a second vessel, separating the ruthenium tetroxide from the other solvent mixture components, delivering the separated ruthenium tetroxide to a second vessel, purging the second vessel to remove unwanted contaminants contained in the second vessel, delivering an amount of the ruthenium tetroxide in the second vessel to a substrate positioned on a substrate support in a processing chamber.

Embodiments of the invention may further provide a process of forming ruthenium tetroxide, comprising the steps of: providing an aqueous solution that comprises a perruthenate material, water and a hypochlorite containing material, adding an amount of an acid to the aqueous solution, adding a solvent to the aqueous solution containing the perruthenate and the hypochlorite to form a solvent mixture, delivering an amount of the solvent mixture to a second vessel, and separating the ruthenium tetroxide from the solvent mixture components.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1A:
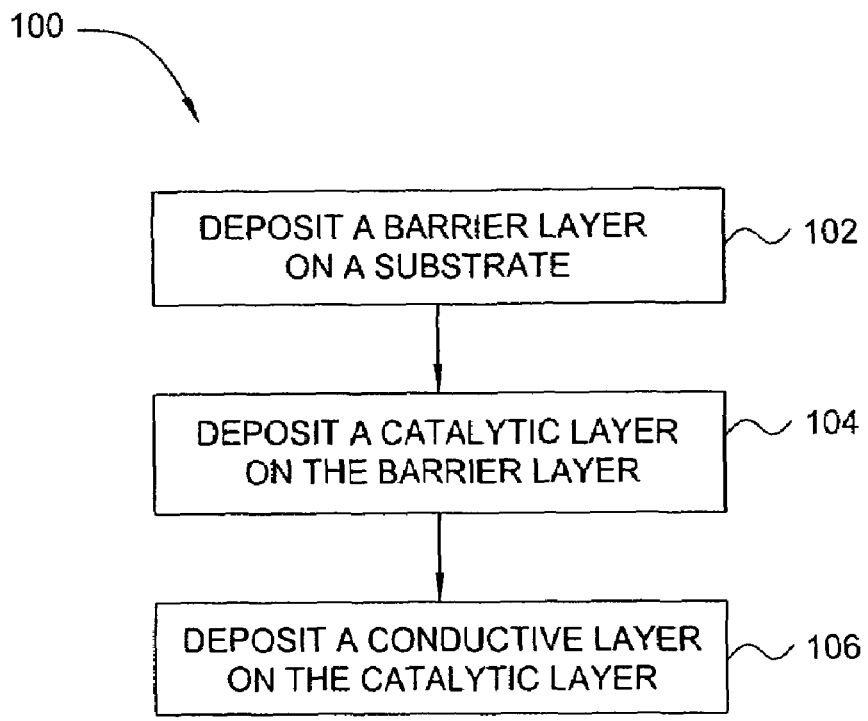
FIG. 1A illustrates a process sequence according to one embodiment described herein.

A method and apparatus for depositing a ruthenium containing layer on a substrate is generally disclosed. The method and apparatus described herein may be especially useful for fabricating electronic devices that are formed on a surface of the substrate or wafer. Generally, the method includes exposing a surface of a substrate to a ruthenium tetroxide vapor to form a catalytic layer on the surface of a substrate and then filling the device structures by an electroless, electroplating, physical vapor deposition (PVD), chemical vapor deposition (CVD), plasma enhanced CVD (PECVD), atomic layer deposition (ALD) or plasma enhanced ALD (PE-ALD) processes. In one aspect, the catalytic layer is a ruthenium containing layer that is adapted to act as a layer that can promote the adhesion between prior and subsequently deposited layers, act as a barrier layer or act as a catalytic layer to promote subsequent PVD, CVD, PECVD, ALD, PE-ALD, electroless and/or electrolytic deposition processes. Due to electromigration, device isolation and other device processing concerns a method and apparatus is described herein that is able to deposit a ruthenium containing layer that is able to strongly bond to the exposed surface(s) of the substrate.

"Atomic layer deposition" (ALD) or "cyclical deposition" as used herein refers to the sequential introduction of two or more reactive compounds to deposit a layer of material on a substrate surface. The two, three or more reactive compounds may alternatively be introduced into a reaction zone of a processing chamber. Usually, each reactive compound is separated by a time delay to allow each compound to adhere and/or react on the substrate surface. In one aspect, a first precursor or compound A is pulsed into the reaction zone followed by a first time delay. Next, a second precursor or compound B is pulsed into the reaction zone followed by a second delay. During each time delay a purge gas, such as nitrogen, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, pulsing compound B and purge gas is a cycle. A cycle may start with either compound A or compound B and continue the respective order of the cycle until achieving a film with the desired thickness.

A "substrate surface" as used herein refers to any substrate or material surface formed on a substrate upon which film processing is performed. For example, a substrate surface on which processing may be performed include materials such as monocrystalline, polycrystalline or amorphous silicon, strained silicon, silicon on insulator (SOI), doped silicon, silicon germanium, germanium, gallium arsenide, glass, sapphire, silicon oxide, silicon nitride, silicon oxynitride and/or carbon doped silicon oxides, such as $SiO_xC_y$, for example, BLACK DIAMOND™ low-k dielectric, available from Applied Materials, Inc., located in Santa Clara, Calif. Substrates may have various dimensions, such as 200 mm or 300 mm diameter wafers, as well as, rectangular or square panes. Embodiments of the processes described herein deposit metal-containing layers on many substrates and surfaces, especially, barrier layers. Substrates on which embodiments of the invention may be useful include, but are not limited to semiconductor wafers, such as crystalline silicon (e.g., Si<100>, Si<111>), silicon oxide, strained silicon, silicon germanium, doped or undoped polysilicon, doped or undoped silicon wafers, and patterned or non-patterned wafers. Substrates made of glass or plastic, which, for example, are commonly used to fabricate flat panel displays and other similar devices, are also included.

A "pulse" as used herein is intended to refer to a quantity of a particular compound that is intermittently or non-continuously introduced into a reaction zone of a processing chamber. The quantity of a particular compound within each pulse may vary over time, depending on the duration of the pulse. The duration of each pulse is variable depending upon a number of factors such as, for example, the volume capacity of the process chamber employed, the vacuum system coupled thereto, and the volatility/reactivity of the particular compound itself. A "half-reaction" as used herein refers to a pulse of a precursor followed by a purge step.

In general, the method and apparatus described herein is adapted to selectively or non-selectively deposit a ruthenium containing layer on device features formed on the surface of a substrate by use of a ruthenium tetroxide containing gas. It is believed that the selective or non-selective deposition of a ruthenium containing layer on the surface of the substrate is strongly dependent on the temperature and type of surfaces that are exposed to the ruthenium tetroxide containing gas. It is also believed that by controlling the temperature of a substrate at a desired temperature below, for example about 180° C., a ruthenium layer will selectively deposit on certain types of surfaces. At higher temperatures, for example greater than 180° C., the ruthenium deposition process from a ruthenium tetroxide containing gas becomes much less selective and thus will allow a blanket film to deposit on all types of surfaces.

In one aspect, the deposition of a ruthenium containing layer is used to promote the adhesion and filling of subsequent layers on the surface of the substrate. In another aspect, the properties of the ruthenium containing layer deposited on the surface of the substrate is specially tailored to fit the needs of the devices formed on the surface of the substrate. Typical desirable properties include the formation of crystalline or amorphous metallic ruthenium layers on the surface of the substrate so that the formed layer(s) can act as a barrier layer, a catalytic layer for subsequent electroless or electroplating processes, or even fill a desired device feature. Another desirable property of ruthenium containing layer is the formation of ruthenium dioxide layer ($RuO_2$) on the surface of the substrate to, for example, promote selective bottom up growth of an electroless and/or electroplated layer, or form an electrode that is compatible with ferroelectric oxides (e.g., BST, etc.), or piezoelectric materials (e.g., PZT, etc.) used to form various Micro-Electro-Mechanical Systems (MEMS) devices.

A. Barrier Layer Deposition Process

In one aspect, a ruthenium containing layer is deposited on a barrier layer on a substrate surface by exposing the barrier layer to a ruthenium containing gas, so that a conductive layer can be deposited on the ruthenium containing layer. Preferably, the barrier layer (e.g., tantalum nitride) is deposited by an ALD process, but may also be deposited by a PVD, CVD or other conventional deposition processes.

FIG. 1A depicts process 100 according to one embodiment described herein for fabricating an integrated circuit. Process 100 includes steps 102-106, wherein during step 102, a metal-containing barrier layer is deposited on a substrate surface. In step 104, the barrier layer is exposed to a ruthenium containing gas while the substrate is maintained at a desired processing temperature to deposit a ruthenium containing layer. Thereafter, a conductive layer is deposited on the catalytic layer during step 106.

Figure 2A:
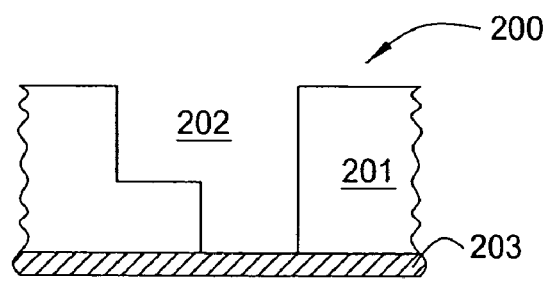
FIGS. 2A-2D illustrate schematic cross-sectional views of an integrated circuit fabrication sequence formed by a process described herein.

Process 100 corresponds to FIGS. 2A-2D by illustrating schematic cross-sectional views of an electronic device at different stages of an interconnect fabrication sequence incorporating one embodiment of the invention. FIG. 2A illustrates a cross-sectional view of substrate 200 having a via or an aperture 202 formed into a dielectric layer 201 on the surface of the substrate 200. Substrate 200 may comprise a semiconductor material such as, for example, silicon, germanium, silicon germanium, for example. The dielectric layer 201 may be an insulating material such as, silicon dioxide, silicon nitride, FSG, and/or carbon-doped silicon oxides, such as $SiO_xC_y$, for example, BLACK DIAMOND™ low-k dielectric, available from Applied Materials, Inc., located in Santa Clara, Calif. Aperture 202 may be formed in substrate 200 using conventional lithography and etching techniques to expose contact layer 203. Contact layer 203 may include doped silicon, copper, tungsten, tungsten silicide, aluminum or alloys thereof.

Barrier Layer Formation

Figure 2B:
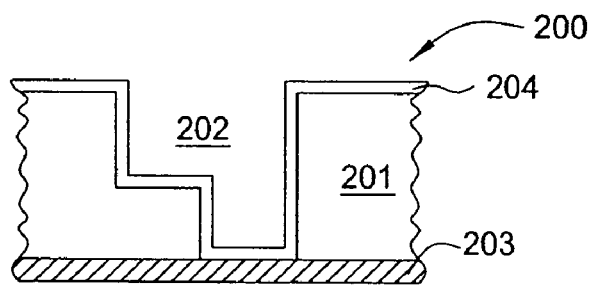
Figure 2C:
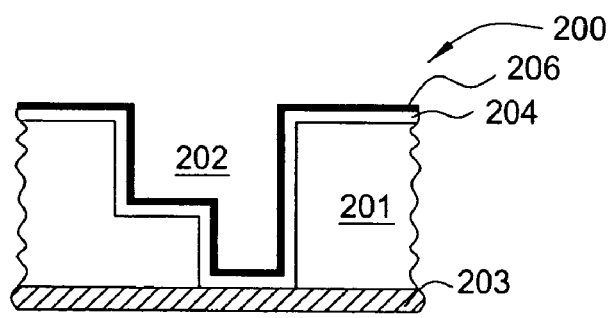

Barrier layer 204 may be formed on the dielectric layer 201 and in aperture 202, as depicted in FIG. 2B. Barrier layer 204 may include one or more barrier materials such as, for example, tantalum, tantalum nitride, tantalum silicon nitride, titanium, titanium nitride, titanium silicon nitride, tungsten nitride, silicon nitride, silicon carbide, derivatives thereof, alloys thereof and combinations thereof. Barrier layer 204 may be formed using a suitable deposition process including ALD, chemical vapor deposition (CVD), physical vapor deposition (PVD) or combinations thereof. For example, a tantalum nitride barrier layer may be deposited using a CVD process or an ALD process wherein a tantalum-containing compound or a tantalum precursor (e.g., PDMAT) and a nitrogen-containing compound or a nitrogen precursor (e.g., ammonia) are reacted. In another example, tantalum and/or tantalum nitride is deposited as barrier layer 204 by an ALD process as described in commonly assigned U.S. patent Ser. No. 10/281,079, filed Oct. 25, 2002, and is herein incorporated by reference. In one example, a Ta/TaN bilayer may be deposited as barrier layer 204, wherein the tantalum layer and the tantalum nitride layer are independently deposited by ALD, CVD and/or PVD processes.

Generally, barrier layer 204 is deposited with a film thickness in a range from about 5 Å to about 150 Å, preferably from about 5 Å to about 50 Å, such as about 20 Å. In one example, barrier layer 204 is deposited on aperture 202 with a sidewall coverage of about 50 Å or less, preferably about 20 Å or less. A barrier layer 204 containing tantalum nitride may be deposited to a thickness of about 20 Å or less is believed to be a sufficient thickness in the application as a barrier to prevent diffusion of subsequently deposited metals, such as copper.

Examples of tantalum-containing compounds that are useful during a vapor deposition process to form a barrier layer, include, but are not limited to precursors such as pentakis (dimethylamino)tantalum (PDMAT or Ta[NMe$_2$]$_5$), pentakis (ethylmethylamino)tantalum (PEMAT or Ta[N(Et)Me]$_5$), pentakis(diethylamino)tantalum (PDEAT or Ta(NEt$_2$)$_5$), tertiarybutyliminotris(dimethylamino)tantalum (TBTDMT or ($^t$BuN)Ta(NMe$_2$)$_3$), tertiarybutyliminotris(diethylamino)tantalum (TBTDET or ($^t$BuN)Ta(NEt$_2$)$_3$), tertiarybutyliminotris (ethylmethylamino)tantalum (TBTEAT or ($^t$BuN)Ta[N(Et)Me]$_3$), tertiaryamylimidotris(dimethylamido)tantalum (TAIMATA or ($^t$AmylN)Ta(NMe$_2$)$_3$, wherein $^t$Amyl is the tertiaryamyl group (C$_5$H$_{11}$— or CH$_3$CH$_2$C(CH$_3$)$_2$—), tertiaryamylimidotris(diethylamido)tantalum (TAIEATA or ($^t$AmylN)Ta(NEt$_2$)$_3$, tertiaryamylimidotris(ethylmethylamido)tantalum (TAIMATA or ($^t$AmylN)Ta([N(Et)Me]$_3$), tantalum halides, such as TaF$_5$ or TaCl$_5$, combinations thereof and/or derivatives thereof. Examples of nitrogen containing-compounds that are useful during the vapor deposition process to form a barrier layer, include, but are not limited to precursors such as ammonia (NH$_3$), hydrazine (N$_2$H$_4$), methylhydrazine (Me(H)NNH$_2$), dimethyl hydrazine (Me$_2$NNH$_2$ or Me(H)NN(H)Me), tertiarybutylhydrazine ($^t$B(H)NNH$_2$), phenylhydrazine (C$_6$H$_5$(H)NNH$_2$), a nitrogen plasma source (e.g., N, N$_2$, N$_2$/H$_2$, NH$_3$, or a N$_2$H$_4$ plasma), 2,2'-azotertbutane ($^t$BuNN$^t$Bu), an azide source, such as ethyl azide (EtN$_3$), trimethylsilyl azide (Me$_3$SiN$_3$), derivatives thereof and combinations thereof.

A barrier layer 204 containing tantalum nitride may be deposited by an ALD process that begins with the adsorption of a monolayer of a tantalum-containing compound on the substrate followed by a monolayer of a nitrogen-containing compound. Alternatively, the ALD process may start with the adsorption of a monolayer of a nitrogen-containing compound on the substrate followed by a monolayer of the tantalum-containing compound. Furthermore, the process chamber is usually evacuated between pulses of reactant gases.

Catalytic Layer formation

Figure 2D:
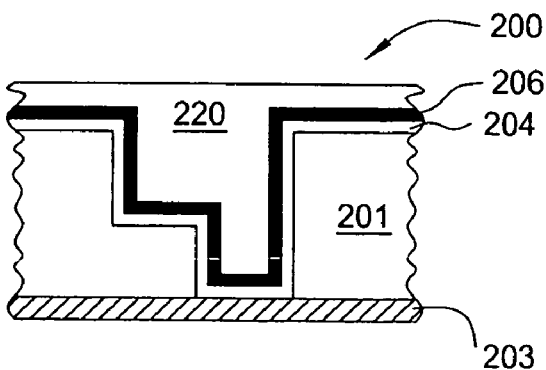

In step 104, a catalytic layer 206 is deposited on barrier layer 204 as depicted in FIG. 2D. Catalytic layer 206 is formed by exposing the barrier layer 204 to a ruthenium containing gas to form a ruthenium containing layer. The barrier layer 204 chemically reduces the ruthenium containing gas to form catalytic layer 206 on barrier layer 204 containing ruthenium. The process of forming the ruthenium containing gas and depositing the ruthenium containing layer is further described below in conjunction with FIGS. 4-7. In one aspect, the catalytic layer may be deposited to a thickness in a range from about an atomic layer to about 100 Å, preferably, from about 2 Å to about 20 Å.

Conductive Layer Formation

Process 100 further includes step 106 to deposit a conductive layer on catalytic layer 206. In FIG. 2F, bulk layer 220 is deposited on the catalytic layer 206. Bulk layer 220 may be comprised of a copper or copper alloy deposited using an electroless copper process alone, such as ALD, CVD, PVD, or in combination with copper electroplating. Bulk layer 220 may have a thickness in a range from about 100 Å to about 10,000 Å. In one example, bulk layer 220 comprises copper and is deposited by an electroless plating process.

An electroplating process may also be completed in a separate electroplating chamber. One method, apparatus and system that may be used to perform an electroplating deposition process is further described in the commonly assigned U.S. patent application Ser. No. 10/268,284, entitled "Electrochemical Processing Cell," by Michael X. Yang et al., filed Oct. 9, 2002 and U.S. Pat. No. 6,258,220, entitled "Electrochemical deposition system," by Yezdi Dordi et al., filed Apr. 8, 1999, which are incorporated by reference herein in its entirety to the extent not inconsistent with the claimed aspects and description herein.

B. Dielectric Deposition Process

In another aspect of the invention, a ruthenium containing layer is directly deposited on a dielectric layer to form a catalytic layer on a surface of a substrate, so that a conductive layer can be deposited on the catalytic layer.

Figure 1B:
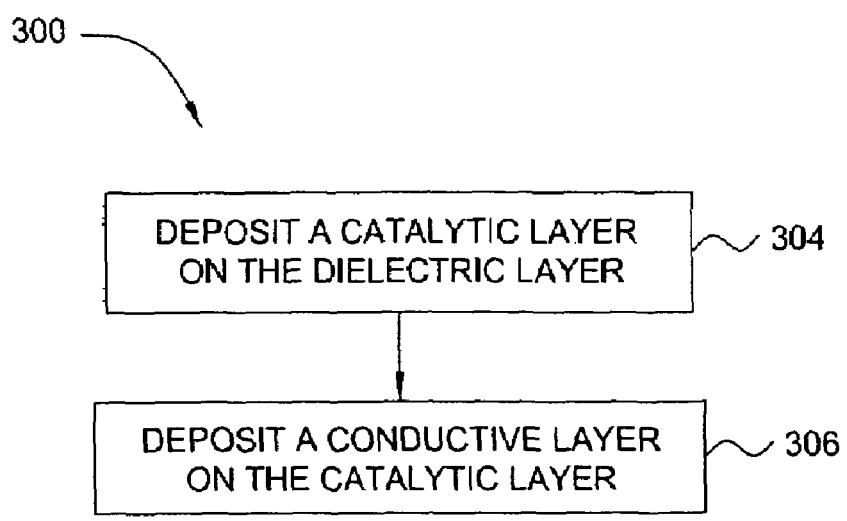
FIG. 1B illustrates another process sequence according to one embodiment described herein.

FIG. 1B depicts process 300 according to one embodiment described herein for fabricating an integrated circuit. Process 300 includes steps 304-306, wherein a catalytic layer is directly deposited on a dielectric surface 251A and contact surface 251B, as illustrated in FIGS. 3A-E. FIGS. 3A-D illustrate schematic cross-sectional views of an electronic device at different stages of an interconnect fabrication sequence, which incorporates at least one embodiment of the invention.

Figure 3A:
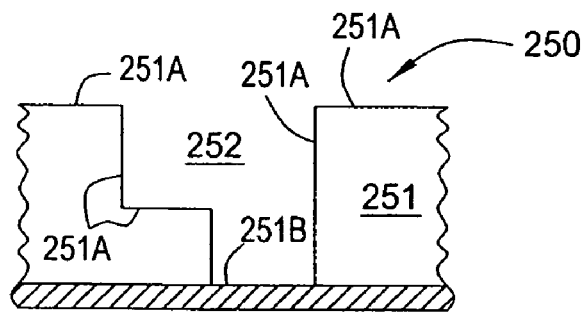
FIGS. 3A-3D illustrate schematic cross-sectional views of integrated circuit fabrication sequence formed by another process described herein.
Figure 3B:
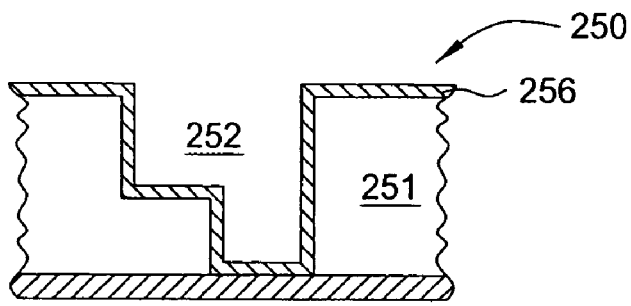
Figure 3C:
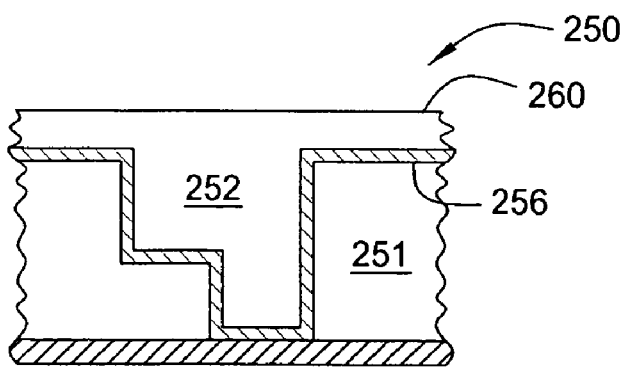
Figure 3D:
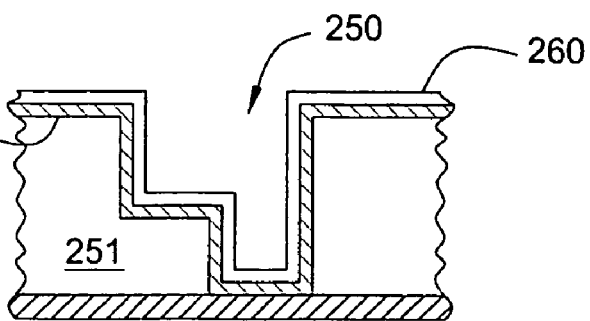

FIG. 3A illustrates a cross-sectional view of substrate 250 having a via or an aperture 252 formed in a dielectric layer 251 on the surface of the substrate 250. In one aspect, the process 300 begins by forming a ruthenium containing layer 256 on the dielectric layer 251 during step 304 by exposing the surface of the substrate 250 to a ruthenium containing gas while the substrate is maintained at a desired processing temperature (see FIG. 3B). Subsequently in step 306, a ruthenium containing layer 256 is deposited on the dielectric layer 251 by allowing the ruthenium components in the ruthenium containing gas form a bond to the surface of the substrate 250. Thereafter, a conductive layer 260 is deposited on the ruthenium containing layer 256 during step 306 (see FIG. 3D).

The surface of dielectric surface 251A is generally an oxide and/or a nitride material comprising silicon. However, the dielectric surface 251A may comprise an insulating material such as, silicon dioxide, and/or carbon-doped silicon oxides, such as SiO$_x$C$_y$, for example, BLACK DIAMOND™ low-k dielectric, available from Applied Materials, Inc., located in Santa Clara, Calif. The contact surface 251B is an exposed region of the underlying interconnect in the lower layer and typically may comprise materials, such as, copper, tungsten, ruthenium, CoWP, CoWPB, aluminum, aluminum alloys, doped silicon, titanium, molybdenum, tantalum, nitrides, silicides of these metals.

Catalytic Layer formation

In step 304, a ruthenium containing layer 256 is deposited on the dielectric layer 251 by the application of a ruthenium containing gas. In one example, the ruthenium containing layer 256 is deposited with a thickness in a range from about an atomic layer to about 100 Å, preferably, from about 5 Å to about 50 Å, for example, about 10 Å. The process of forming the ruthenium containing gas and depositing the ruthenium containing layer is further described below in conjunction with FIGS. 4-7. In general, the ruthenium containing layer 256 is deposited such that the formed layer will adheres to the dielectric layer 251 as well as the subsequent conducting layer, such as a seed layer or a bulk layer.

Conductive Layer Formation

Process 300 further includes step 306 to deposit a conductive layer 260 on the ruthenium containing layer 256. The conductive layer 260 may form a seed layer (e.g., a thin metal layer (see FIG. 3D)) or a bulk layer (e.g., fill the aperture 252 (see FIG. 3C)) that is deposited on the ruthenium containing layer 256. A seed layer may be a continuous layer deposited by using conventional deposition techniques, such as ALD, CVD, PVD, electroplating or electroless processes. The invention as described herein may be advantageous, since the deposition of a ruthenium containing layer on the surface of the substrate can be a seed layer for direct depositing an electroplated layer. Seed layers may have a thickness in a range from about a single molecular layer from about 20 to about 100 Å. Generally, a seed layer contains copper or a copper alloy.

Ruthenium Tetroxide Formation and Deposition Apparatus and Method

The process of depositing a ruthenium containing layer having desirable properties on a surface of a substrate, e.g., step 104 in FIG. 1A and step 304 in FIG. 1B, may be performed by completing the process steps 702-706 in process 700, which is discussed below. In general, the process step 104 in FIG. 1A and step 304 in FIG. 1B are adapted to form a ruthenium containing layer having desirable properties by generating a ruthenium tetroxide containing gas and exposing a temperature controlled surface of a substrate. As noted above in various aspects of the invention it may be desirable to selectively or non-selectively form a metallic ruthenium layer or a ruthenium dioxide layer on the surface of the substrate to form a ruthenium containing layer. An exemplary apparatus and method of forming a ruthenium tetroxide containing gas to form a ruthenium containing layer on a surface of a substrate is described herein.

Figure 4:
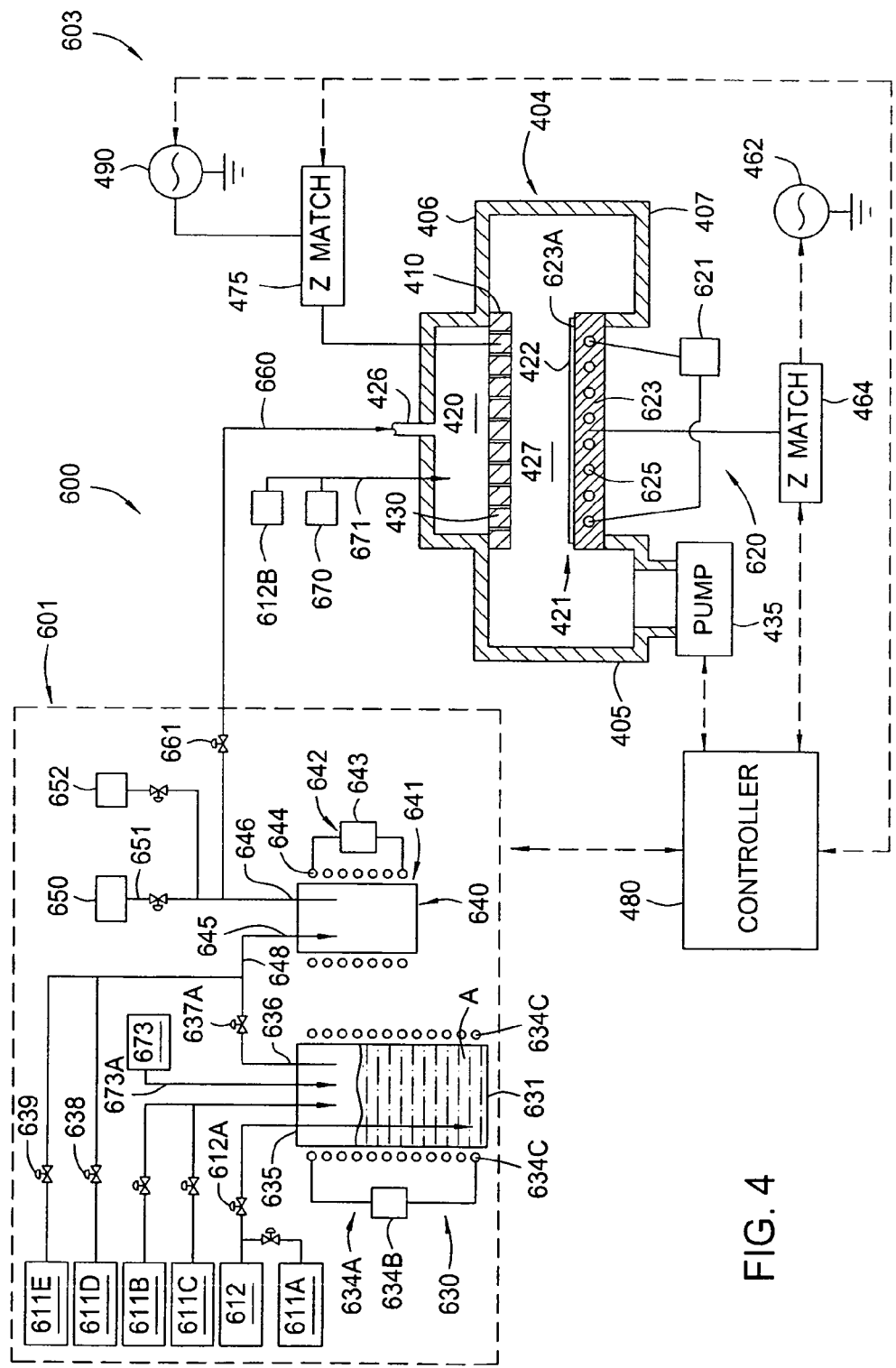
FIG. 4 illustrates a cross-sectional view of a deposition chamber that may be adapted to perform an embodiment described herein.

FIG. 4 illustrates one embodiment of a deposition chamber 600 that can be adapted to generate and deposit a ruthenium containing layer on a surface of a substrate. In one embodiment, the ruthenium containing layer is formed on a surface of a substrate by creating ruthenium tetroxide in an external vessel and then delivering the generated ruthenium tetroxide gas to a surface of a temperature controlled substrate positioned in a processing chamber.

In one embodiment, a ruthenium tetroxide containing gas is generated, or formed, by passing an ozone containing gas across a ruthenium source that is housed in an external vessel. In one aspect, the ruthenium source is maintained at a temperature near room temperature. In one aspect, the ruthenium source contains an amount of ruthenium metal (Ru) which reacts with the ozone. In one aspect, the metallic ruthenium source contained in the external vessel is in a powder, a porous block, or solid block form.

In another aspect, the ruthenium source housed in the external vessel contains an amount of a perruthenate material, such as sodium perruthenate (NaRuO$_4$) or potassium perruthenate (KRuO$_4$) which will react with the ozone, likely according to reaction (1) or (2), to form ruthenium tetroxide (RuO$_4$) a compound that is volatile at the reaction conditions.

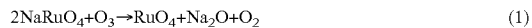
$$2NaRuO_4 + O_3 \rightarrow RuO_4 + Na_2O + O_2 \quad (1)$$

$$2KRuO_4 + O_3 \rightarrow RuO_4 + K_2O + O_2 \quad (2)$$

It should be noted that the list of materials shown here are not intended to be limiting, and thus any material that upon exposure to ozone or other oxidizing gases forms a ruthenium tetroxide containing gas may be used without varying from the basic scope of the invention. To form the various ruthenium source materials used in the external vessel, various conventional forming processes may be used. One example of a conventional process that may be used to form the a perruthenate is by mixing metallic ruthenium powder with sodium peroxide (Na$_2$O$_2$) and then sintering the mixture in a furnace or vacuum furnace at temperature of about 500° C. Some references have suggested use of a spray pyrolysis type processes may be used to form the peruthenate materials. For example, in a spray pyrolysis system, non-volatile materials, such as sodium peroxide and ruthenium, are placed in a flowable medium, such as water, that are atomized to form droplets and the droplets are heated in a furnace, conventional thermal spray device, or other device, to form a powder containing the reacted materials (e.g., NaRuO$_4$).

The deposition chamber 600 generally contains a process gas delivery system 601 and a processing chamber 603. FIG. 4 illustrates one embodiment of a process chamber 603 that may be adapted to deposit the ruthenium containing layers on the surface of a substrate. In one aspect, the processing chamber 603 is a processing chamber 603 that may be adapted to deposit a layer, such as a barrier layer (FIGS. 2A-D), on the surface of the substrate by use of a CVD, ALD, PECVD or PE-ALD process prior to depositing a ruthenium containing layer on the surface of the substrate. In another aspect, the processing chamber 603 is adapted to primarily deposit the ruthenium containing layer and thus any prior or subsequent device fabrication steps are performed in other processing chambers. In one aspect, the prior or subsequent processing chambers and the processing chamber 603 are attached to a cluster tool (FIG. 8) that is adapted to perform a desired device fabrication process sequence. For example, in process sequences where a barrier layer is deposited prior to the ruthenium containing layer, the barrier layer may be deposited in an ALD process chamber, such as the Endura iCuB/S™ chamber or Producer™ type process chamber, prior to forming the ruthenium containing layer in the processing chamber 603. In yet another aspect, the processing chamber 603 is a vacuum processing chamber that is adapted to deposit the ruthenium containing layer at a sub atmospheric pressure, such as a pressure between about 0.1 mTorr and about 50 Torr. The use of a vacuum processing chamber during processing can be advantageous, since processing in a vacuum condition can reduce the amount of contamination that can be incorporated in the deposited film. Vacuum processing will also improve the diffusion transport process of the ruthenium tetroxide to the surface of the substrate and tend to reduce the limitations caused by convective type transport processes.

The processing chamber 603 generally contains a processing enclosure 404, a gas distribution showerhead 410, a temperature controlled substrate support 623, a remote plasma source 670 and the process gas delivery system 601 connected to the inlet line 426 of the processing chamber 603. The processing enclosure 404 generally contains a sidewall 405, a ceiling 406 and a base 407 enclose the processing chamber 603 and form a process area 421. A substrate support 623, which supports a substrate 422, mounts to the base 407 of the processing chamber 603. A backside gas supply (not shown) furnishes a gas, such as helium, to a gap between the backside of the substrate 422 and the substrate support surface 623A to improve thermal conduction between the substrate support 623 and the substrate 422. In one embodiment of the deposition chamber 600, the substrate support 623 is heated and/or cooled by use of a heat exchanging device 620 and a temperature controller 621, to improve and control properties of the ruthenium layer deposited on the substrate 422 surface. In one aspect, the heat exchanging device 620 is a fluid heat exchanging device that contains embedded heat transfer lines 625 that are in communication with a temperature controlling device 621 which controls the heat exchanging fluid temperature. In another aspect, the heat exchanging device 620 is a resistive heater, in which case the embedded heat transfer lines 625 are resistive heating elements that are in communication with the temperature controlling device 621. In another aspect, the heat exchanging device 620 is a thermoelectric device that is adapted to heat and cool the substrate support 623. A vacuum pump 435, such as a turbopump, cryo-turbo pump, roots-type blower, and/or rough pump, controls the pressure within the processing chamber 603. The gas distribution showerhead 410 consists of a gas distribution plenum 420 connected to the inlet line 426 and the process gas delivery system 601. The inlet line 426 and process gas delivery system 601 are in communication with the process region 427 over the substrate 422 through plurality of gas nozzle openings 430.

In one aspect of the invention it may be desirable to generate a plasma during the deposition process to improve the deposited ruthenium containing layer's properties. In this configuration, the showerhead 410, is made from a conductive material (e.g., anodized aluminum, etc.), which acts as a plasma controlling device by use of the attached to a first impedance match element 475 and a first RF power source 490. A bias RF generator 462 applies RF bias power to the substrate support 623 and substrate 422 through an impedance match element 464. A controller 480 is adapted to control the impedance match elements (i.e., 475 and 464), the RF power sources (i.e., 490 and 462) and all other aspects of the plasma process. The frequency of the power delivered by the RF power source may range between about 0.4 MHz to greater than 10 GHz. In one embodiment dynamic impedance matching is provided to the substrate support 623 and the showerhead 410 by frequency tuning and/or by forward power serving. While FIG. 4 illustrates a capacitively coupled plasma chamber, other embodiments of the invention may include inductively coupled plasma chambers or combination of inductively and capacitively coupled plasma chambers with out varying from the basic scope of the invention.

In one embodiment, the processing chamber 603 contains a remote plasma source (RPS) (element 670 in FIGS. 4, 6A-C and 11) that is adapted to deliver various plasma generated species or radicals to the processing region 427 through an inlet line 671. An RPS that may be adapted for use with the deposition chamber 600 is an Astron® Type AX7651 reactive gas generator from MKS ASTeX® Products of Wilmington, Mass. The RPS is generally used to form, reactive components, such as hydrogen (H) radicals, which are introduced into the processing region 427. The RPS thus improves the reactivity of the excited gas species to enhance the reaction process. A typical RPS process may include using 1000 sccm of $H_2$ and 1000 sccm of argon and an RF power of 350 Watts and a frequency of about 13.56 MHz. In one aspect a forming gas, such as a gas containing 4% $H_2$ and the balance nitrogen may be used. In another aspect a gas containing hydrazine ($N_2H_4$) may be used. In general, the use of plasma excitation to generate reducing species capable of converting $RuO_2$ to Ru will allow this reaction to proceed at lower temperatures. This process may be most useful when it is desired to deposit the $RuO_2$ selectively, generally below approximately 180° C. and then subsequently perform the reduction to metallic ruthenium at the same temperature and/or in the same chamber.

In one embodiment of the deposition chamber 600, a process gas delivery system 601 is adapted to deliver a ruthenium containing gas, or vapor, to the processing region 427 so that a ruthenium containing layer can be formed on the substrate surface. The process gas delivery system 601 generally contains one or more gas sources 611A-E, an ozone generating device 612, a processing vessel 630, a source vessel assembly 640 and an outlet line 660 attached to the inlet line 426 of the processing chamber 603. The one or more gas sources 611A-E are generally sources of various carrier and/or purge gases that may be used during processing in the processing chamber 603. The one or more gases delivered from the gas sources 611A-E may include, for example, nitrogen, argon, helium, hydrogen, or other similar gases.

Typically, the ozone generator 612 is a device which converts an oxygen containing gas from an gas source (not shown) attached to the ozone generator 612 into a gas containing between about 4 wt. % and about 100 wt. % of ozone ($O_3$), with the remainder typically being oxygen. Preferably, the concentration of ozone is between about 6 wt. % and about 100 wt. %. It should be noted that forming ozone in concentrations greater than about 15% will generally require a purification process that may require a process of adsorbing ozone on a cold surface in a processing vessel and then purging the vessel using an inert gas to remove the contaminants. However, the ozone concentration may be increased or decreased based upon the amount of ozone desired and the type of ozone generating equipment used. A typical ozone generator that may be adapted for use with the deposition chamber 600 are the Semozon® and Liquozon® Ozone generators that can be purchased from MKS ASTeX® Products of Wilmington, Mass. The gas source 611A may be adapted to purge or as a carrier gas to deliver the ozone generated in the ozone generator 612 to the input port 635 of the processing vessel 630.

In one embodiment of the process gas delivery system 601, the processing vessel 630 contains a vessel 631, a temperature controlling device 634A, an input port 635 and an output port 636. The vessel 631 is generally an enclosed region made of or coated with glass, ceramic or other inert material that will not react with the processing gas formed in the vessel 631. In one aspect, the vessel 631 contains a volume of a ruthenium source (e.g., ruthenium metal, sodium perruthenate; see element "A"), preferably in a porous-solid, powder, or pellet form, to promote the formation of ruthenium tetroxide when the ozone gas is delivered to the vessel 631. The temperature controlling device 634A generally contains a temperature controller 634B and a heat exchanging device 634C, which are adapted to control the temperature of the vessel 631 at a desired processing temperature during the ruthenium tetroxide generation process. In one aspect, the heat exchanging device 634C is a temperature controlled fluid heat exchanging device, a resistive heating device and/or a thermoelectric device that is adapted to heat and/or cool the vessel 631 during different phases of the process.

In one embodiment, a remote plasma source 673 is connected to the processing vessel 630 via the RPS inlet line 673A so that in different phases of the ruthenium tetroxide formation process the ruthenium source can be regenerated by injecting hydrogen (H) radicals into the vessel 631 to reduce any formed oxides on the surface of the ruthenium source. Regeneration may be necessary when an undesirable layer of ruthenium dioxide ($RuO_2$) is formed on a significant portion of the exposed ruthenium source contained in the vessel 631. In one embodiment, the regeneration process is performed when by introducing a hydrogen containing gas to the ruthenium source that has been heated to an elevated temperature in an effort to reduce the formed oxides.

Referring to FIG. 4, the source vessel assembly 640 generally contains a source vessel 641, a temperature controller 642, an inlet port 645 and an outlet port 646. The source vessel 641 is adapted to collect and retain the ruthenium tetroxide generated in the processing vessel 630. The source vessel 641 is generally lined, coated or made from a glass, ceramic, plastic (e.g., Teflon, polyethylene, etc.), or other material that will not react with the ruthenium tetroxide and has desirable thermal shock and mechanical properties. When in use the temperature controller 642 cools the source vessel 641 to a temperature less than 20° C. to condense the ruthenium tetroxide gas on to the walls of the source vessel. The temperature controller 642 generally contains a temperature controller device 643 and a heat exchanging device 644, which are adapted to control the temperature of the source vessel 641 at a desired processing temperature. In one aspect, the heat exchanging device 644 is a temperature controlled fluid heat exchanging device, a resistive heating device and/or a thermoelectric device that is adapted to heat and cool the source vessel 641.

Figure 5:
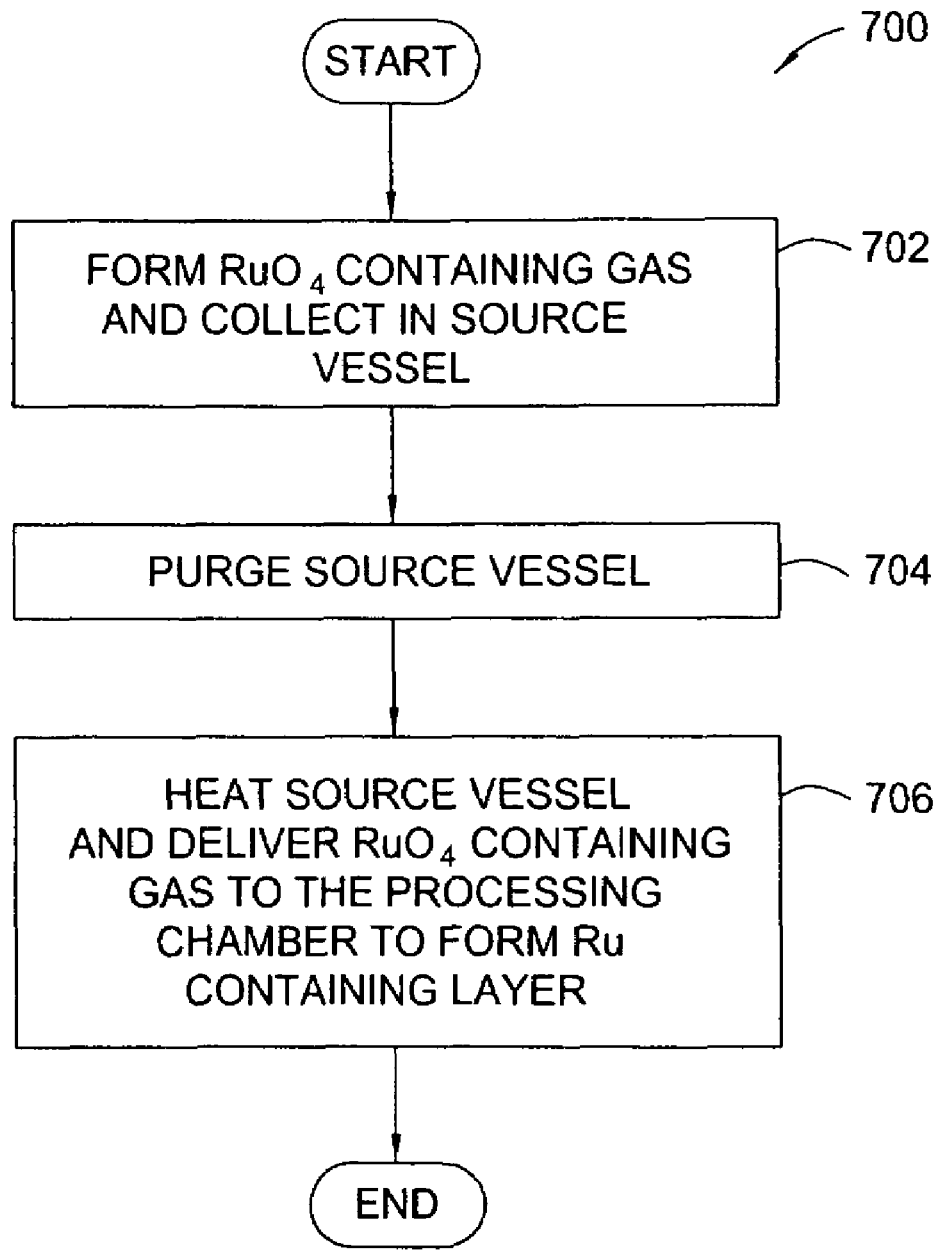
FIG. 5 illustrates another process sequence according to one embodiment described herein.

FIG. 5 depicts process 700 according to one embodiment described herein for forming a ruthenium containing layer on a surface of a substrate. Process 700 includes steps 702-708, wherein a ruthenium containing layer is directly deposited on surface of a substrate. The first process step 702 of process 700 includes step of forming a ruthenium tetroxide gas and collecting the generated gas in the source vessel 641. In process step 702, ozone generated in the ozone generator 612 is delivered to the ruthenium source contained in the processing vessel 631 to form a flow of a ruthenium tetroxide containing gas, which is collected in the vessel 641. Therefore, during process step 702 an ozone containing gas flows across the ruthenium source which causes ruthenium tetroxide to be formed and swept away by the flowing gas. During this process the gas flow path is from the ozone generator 612, in the inlet port 635, across the ruthenium source (item "A"), through the outlet port 636 in the vessel 631 through the process line 648 and into the closed source vessel 641. In one embodiment, it may be desirable to evacuate the source vessel 641 using a conventional vacuum pump 652 (e.g., conventional rough pump, vacuum ejector), prior to introducing the ruthenium tetroxide containing gas. In one aspect, the gas source 611A is used to form an ozone containing gas that contains pure oxygen and ozone or an inert gas diluted oxygen containing gas and ozone. In one aspect of process step 702, the ruthenium source (item "A") contained in the vessel 631 is maintained at a temperature between about 0° C. and about 100° C., and more preferably between about 20° C. and about 60° C. to enhance the ruthenium tetroxide formation process in the vessel 631. While a lower ruthenium tetroxide generation temperature is generally desirable, it is believed that the required temperature to form a ruthenium tetroxide gas is somewhat dependent on the amount of moisture contained in the vessel 631 during processing. During process step 702, the source vessel 641 is maintained at a temperature below about 25° C. at pressures that allow the generated ruthenium tetroxide to condensed, or crystallized (or solidified), on the walls of the source vessel 641. For example, the source vessel 641 is maintained at a pressure of about 5 Torr and a temperature between about −20 and about 25° C. By cooling the ruthenium tetroxide and causing it to condense or solidify on the walls of the source vessel 641 the unwanted oxygen ($O_2$) and ozone ($O_3$) containing components in the ruthenium tetroxide containing gas can be separated and removed in the second process step 704. In one aspect, it may be desirable to inject an amount of water, or a water containing gas, into the vessel 631 to promote the ruthenium tetroxide generation process. The injection of water may be important to improve the dissociation of the ruthenium tetroxide from the ruthenium source, for example, when ruthenium source contains sodium perruthenate or potassium perruthenate. In one aspect, it may be desirable to remove the excess water by a conventional physical separation (e.g., molecular sieve) process after the dissociation process has been performed.

The second process step 704, or purging step, is designed to remove the unwanted oxygen ($O_2$) and unreacted ozone ($O_3$) components from the ruthenium tetroxide containing gas. Referring to FIG. 4, in one embodiment the second process step 704 is completed while the walls of the source vessel 641 are maintained at a temperature of 25° C. or below, by closing the ozone isolation valve 612A and flowing one or more purge gasses from the one or more of the gas sources 611B-C through the processing vessel 630, into the process line 648, through the source vessel 641 and then through the exhaust line 651 to the exhaust system 650. The amount of un-solidified or un-condensed ruthenium tetroxide that is wasted during the completion of process step 704, can be minimized by adding a wait step of a desired length between the process step 702 and process step 704 to allow the ruthenium tetroxide time to condense or solidify. The amount of un-solidified or un-condensed ruthenium tetroxide that is wasted can be further reduced also by lowering the source vessel wall temperature to increase the rate of solidification, and/or increasing the surface area of the source vessel to increase the interaction of the walls and the ruthenium tetroxide containing gas. The purge gases delivered from the one or more gas sources 611B-C can be, for example, nitrogen, argon, helium, or other dry and clean process gas. Since the unwanted oxygen ($O_2$) and unreacted ozone ($O_3$) components can cause unwanted oxidation of exposed surfaces on the substrate the process of removing these components can be critical to the success of the ruthenium deposition process. Removal of these unwanted oxygen ($O_2$) and unreacted ozone ($O_3$) components is especially important where copper interconnects are exposed on the surface of the substrate, since copper has a high affinity for oxygen and is corroded easily in the presence of an oxidizing species. In one embodiment, the process step 704 is completed until the concentration of oxygen ($O_2$) and/or unreacted ozone ($O_3$) is below about 100 parts per million (ppm). In one aspect, it may be desirable to heat the vessel 631 to a temperature between about 20° C. and 25° C. during the process step 704 to assure that all of the formed ruthenium tetroxide has been removed from the process vessel 630.

In one aspect, the purging process (step 704) is completed by evacuating the source vessel 641 using a vacuum pump 652 to remove the contaminants. To prevent an appreciable amount of ruthenium tetroxide being removed from the source vessel assembly 640 during this step the temperature and pressure of the vessel may be controlled to minimize the loss due to vaporization. For example, it may be desirable to pump the source vessel assembly 640 to a pressure of about 5 Torr while it is maintained at a temperature below about 0° C.

In one embodiment, the third process step 706, or deliver the ruthenium tetroxide to the processing chamber 603 step, is completed after the source vessel 641 has been purged and valve 637A is closed to isolate the source vessel 641 from the processing vessel 630. The process step 706 starts when the source vessel 641 is heated to a temperature to cause the condensed or solidified ruthenium tetroxide to form a ruthenium tetroxide gas, at which time the one or more of the gas sources 611 (e.g., items 611D and/or 611E), the gas sources associated isolation valve (e.g., items 638 and/or 639) and process chamber isolation valve 661 are opened which causes a ruthenium tetroxide containing gas to flow into the inlet line 426, through the showerhead 410, into an process region 427 and across the temperature controlled substrate 422 so that a ruthenium containing layer can be formed on the substrate surface. In one embodiment, the source vessel 641 is heated to a temperature between about 0° C. and about 50° C. to cause the condensed or solidified ruthenium tetroxide to form a ruthenium tetroxide gas. It should be noted that even at the low temperatures, for example about 5° C., an equilibrium partial pressure of ruthenium tetroxide gas will exist in the source vessel 641. Therefore, in one aspect, by knowing the mass of ruthenium tetroxide contained in the vessel, by knowing the volume and temperature of the source vessel 641, a repeatable mass can be delivered to the processing chamber 603. In another aspect, a continuous flow of a ruthenium tetroxide containing gas can be formed and delivered to the processing chamber 603, by knowing the sublimation or vaporization rate of the ruthenium tetroxide at a given temperature for a given sized source vessel 641 and flowing a carrier gas at a desired rate through the source vessel 641 to form a gas having a desired concentration of ruthenium tetroxide.

In order to deposit a ruthenium containing layer non-selectively on a surface of the substrate, it is believed that at temperatures greater then 180° C. ruthenium tetroxide ($RuO_4$) is will undergo a spontaneous decomposition to thermodynamically stable ruthenium dioxide ($RuO_2$), and at slightly higher temperatures in the presence of hydrogen ($H_2$) the deposition proceeds directly to a desired outcome of forming a metallic ruthenium layer. The balanced equation for the reaction is shown in equation (3).

$$RuO_4 + 4H_2 \rightarrow Ru(metal) + 4H_2O \qquad (3)$$

Therefore, in one aspect of the invention, during the process step 706 the substrate surface is maintained, by use of the temperature controlled substrate support 623, at a temperature above about 180° C., and more preferably at a temperature between of about 180° C. and about 450° C., and more preferably a temperature between about 200° C. and about 400° C. To form a metallic ruthenium layer the temperature may be between about 300° C. and about 400° C. Typically the processing chamber pressure is maintained at a pressure below about 10 Torr, and preferably between about 500 milliTorr (mT) and about 5 Torr. By controlling the temperature of the surface of the substrate the selectivity of the deposited ruthenium containing layer and crystal structure of the deposited ruthenium containing layer can be adjusted and controlled as desired. It is believed that a crystalline ruthenium containing layer will be formed at temperatures above 350° C.

In one aspect of the process step 706, a the ruthenium tetroxide containing gas is formed when a nitrogen containing gas is delivered from the gas source 611D and a hydrogen ($H_2$) containing gas (e.g., hydrogen ($H_2$), hydrazine ($N_2H_4$)) is delivered from the gas source 611E through the source vessel assembly 640 containing an amount of ruthenium tetroxide and then through the process chamber 603. For example, 100 sccm of nitrogen and 100 sccm of $H_2$ gas is delivered to the process chamber 603 which is maintained at a pressure between about 0.1 and about 10 Torr, and more preferably about 2 Torr. The desired flow rate of the gasses delivered from the gas sources 611 (e.g., items 611D-E) is dependent upon the desired concentration of the ruthenium tetroxide in the ruthenium tetroxide containing gas and the vaporization rate of the ruthenium tetroxide from the walls of the source vessel 641.

In one embodiment, the remote plasma source 670 is utilized during the process step 706 to enhance the process of forming a metallic ruthenium layer. In this case H radicals generated in the remote plasma source are injected into the processing region 427 to reduce any formed oxides on the surface of the ruthenium source. In one aspect the RPS is used to generate H radicals as the ruthenium tetroxide containing gas is delivered to the processing region 427. In another aspect, the RPS is only used after each successive monolayer of ruthenium has been formed and thus forms a two step process consisting of a deposition step and then a reduction of the ruthenium layer step.

In one embodiment of process step 706, the amount of ruthenium tetroxide gas generated and dispensed in the process chamber 603 is monitored and controlled to assure that the process is repeatable, complete saturation of the process chamber components is achieved and a desired thickness of the ruthenium containing film has been deposited. In one aspect, the mass of the ruthenium tetroxide delivered to the process chamber is monitored by measuring the change in weight of the source vessel 641 as a function of time, by use of a conventional electronic scale, load cell, or other weight measurement device.

Figure 7:
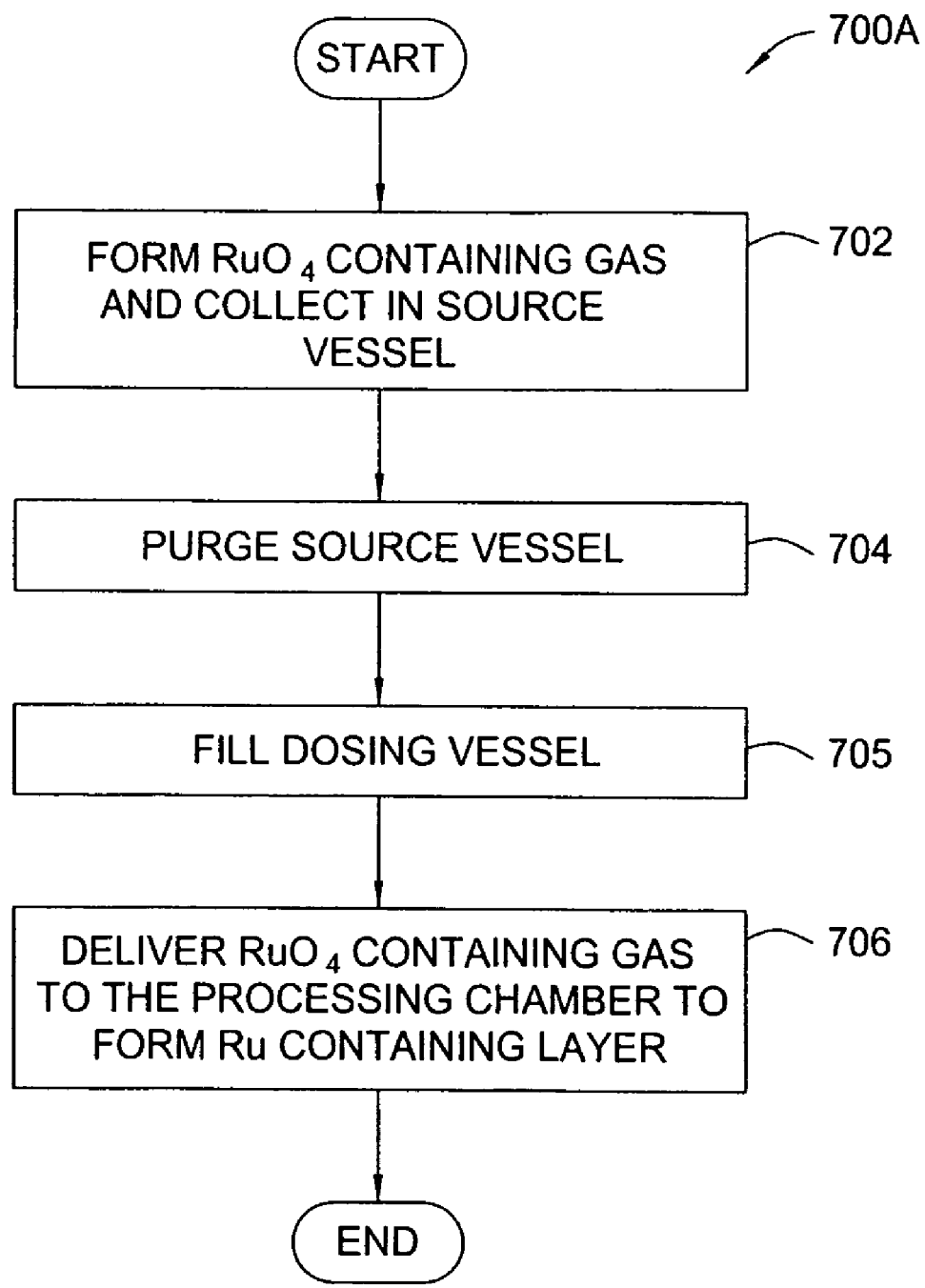
FIG. 7 illustrates another process sequence according to one embodiment described herein.

In one embodiment, the gas delivery system 601 is adapted to deliver a single dose, or mass of ruthenium tetroxide, to the process chamber 603 and the substrate to form a ruthenium containing layer on the surface of the substrate. In another embodiment, multiple sequential doses of ruthenium tetroxide are delivered to the process chamber 603 to form a multilayer ruthenium containing film. To perform the multiple sequential doses at least one of the process steps 702 through 706, described in conjunction with FIG. 5 or 7, are repeated multiple times to form the multilayer ruthenium containing film. In another embodiment, the surface area of the source vessel 641 and the length of the process step 702 are both sized to allow a continuous flow of a desired concentration of a ruthenium tetroxide containing gas across the surface of the substrate during the ruthenium containing layer deposition process. The gas flow distribution across the surface of the substrates can be important to the formation of uniform layers upon substrates processed in the processing chamber, especially for processes that are dominated by mass transport limited reactions (CVD type reactions) and for ALD type processes where rapid surface saturation is required for reaction rate limited deposition. Therefore, the use of a uniform gas flow across the substrate surface by use of a showerhead 410 may be important to assure uniform process results across the surface of the substrate.

In one aspect of the invention, the process of delivering a mass of ruthenium tetroxide into the process chamber 603 has advantages over conventional ALD or CVD type processes, because the organic material found in the ALD or CVD precursor(s) are not present in the ruthenium containing gas and thus will not be incorporated into the growing ruthenium containing layer. The incorporation of the organic materials in the growing ruthenium film can have large affect on the electrical resistance, adhesion and the stress migration and electromigration properties of the formed device(s). Also, since the size of the ruthenium tetraoxide molecule is much smaller than the traditional ruthenium containing precursors the ruthenium containing layer deposition rate per ALD cycle using ruthenium tetroxide will be increased over conventional precursors, due to the improved ruthenium coverage per ALD cycle.

Figure 6A:
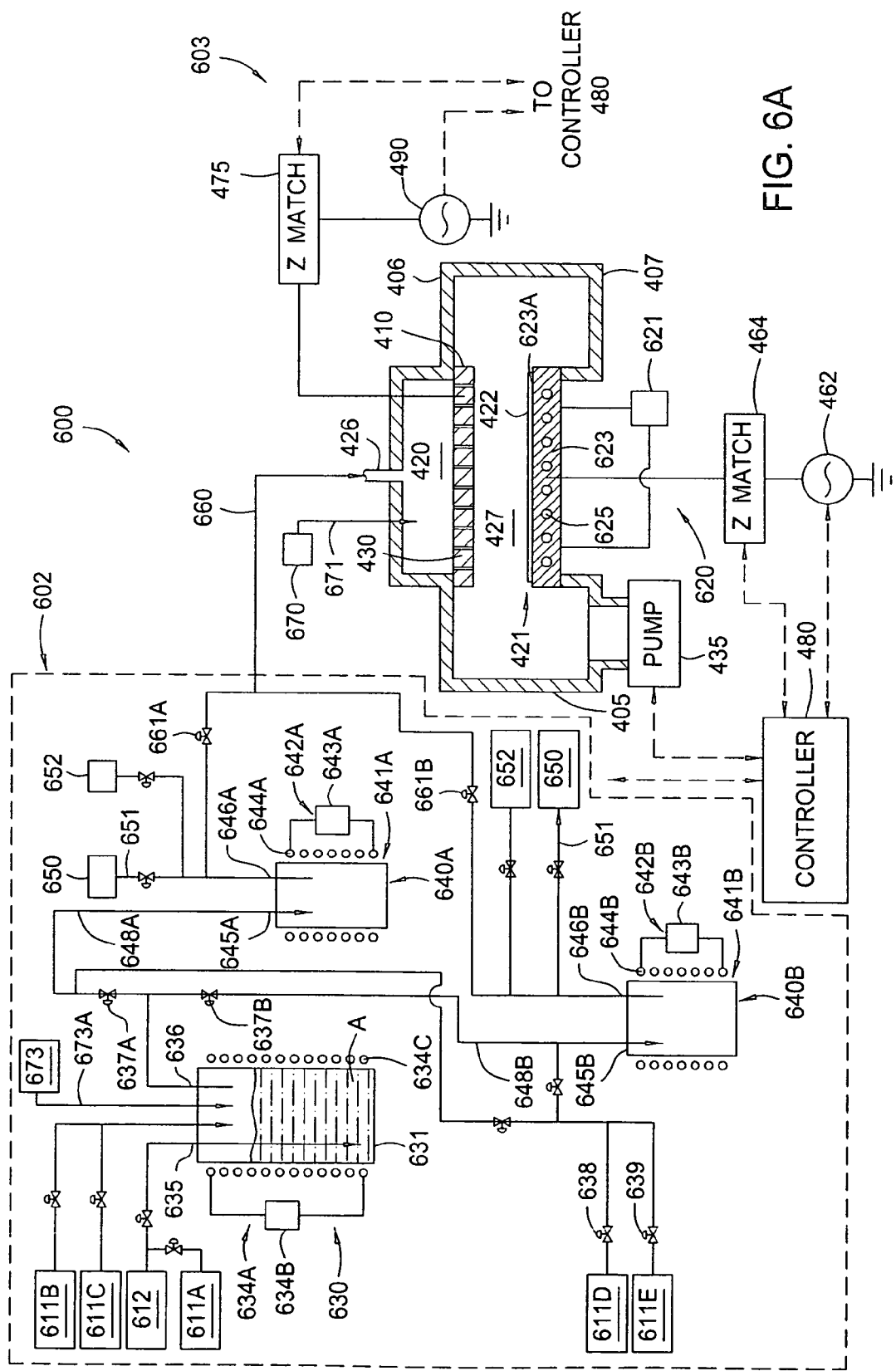
FIGS. 6A-6C illustrate a cross-sectional view of a process chamber that may be adapted to perform an embodiment described herein.

FIG. 6A illustrates another embodiment of a gas delivery system 602 found in the deposition chamber 600. The gas delivery system 602 is similar to the gas delivery system 601, described in relation to FIG. 4, except that the gas delivery system 602 contains two or more source vessel assemblies 640 (e.g., items 640A-B). Each of the source vessel assemblies 640A and 640B each contain their own source vessels (elements 641A-641B), a temperature controller (elements 642A-B), a temperature controller device (elements 643A-B), a heat exchanging device (elements 644A-B), an inlet port (elements 645A-B) and an outlet port (elements 646A-B). In this configuration, as shown in FIG. 6A, the two source vessels 640A-B are used to alternately collect and dispense the generated ruthenium tetroxide so that the chamber process will not be interrupted by the time that is required to collect the ruthenium tetroxide in a single source vessel. For example, when the first source vessel 640A is completing process step 706 on a substrate positioned in the process chamber 603, using the gas sources 611D-E, first source vessel 641A and process chamber isolation valve 661A, the second source vessel 640B can be completing process step 702, using the ozone generator 612, the processing vessel 631, source vessel 640B, inlet port 635, outlet port 636, isolation valve 637B and the process line 648B.

Figure 6B:
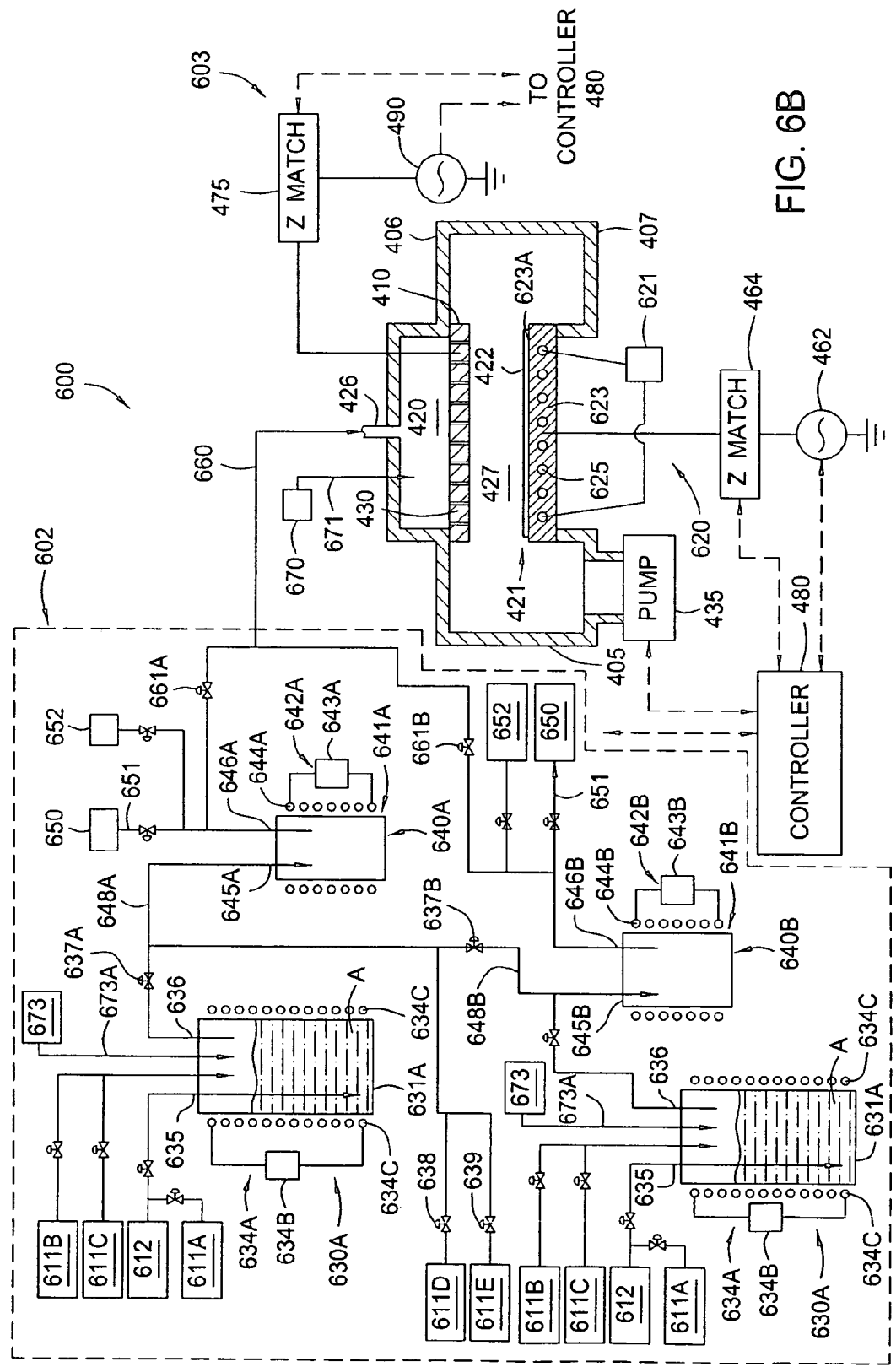

FIG. 6B illustrates one aspect of the gas delivery system 602, where each of the two or more source vessel assemblies 640 (e.g., element 640A or 640B) are separately supported by their own, or a separate, processing vessel 630. This configuration may be advantageous when one of the vessels 631 (e.g., 631A or 631B) need to be replaced when the ruthenium source material has been depleted or a maintenance activity needs to be performed on one of the vessels. In one embodiment, as shown in FIG. 6B, the gas sources 611A-C and the ozone generator 612 are shared by the first processing vessel 630A and the second processing vessel 630B.

In one aspect of the gas delivery system 602, the controller 480 is adapted to monitor the process(es) being performed in the process chamber 603, in an effort to assure that at least one of the source vessels 640A or 640B contains a desired amount of the solidified or crystallized ruthenium tetroxide at any given time. Typical aspects of the process that the controller 480 that may need to monitored are the mass of ruthenium tetroxide in the source vessels 640A-B, the state of the process that is on-going in the process chamber 603 and/or whether one or more substrates are waiting to be processed in the deposition chamber 600. In this way the gas delivery system 602 is adapted to look ahead and adjust the rate of generation of the ruthenium tetroxide as needed, to assure that at least one of the vessels 640A-B contains a desired mass of precursor at a desired time. This configuration is important since the ruthenium tetroxide generation process, can be kinetically limited by the reaction rate of ozone with the ruthenium or mass transport limited due to the flow of the ozone containing gas across the surface of the ruthenium source contained in the processing vessel 631. Therefore, based on multiple process variables the ruthenium tetroxide generation process will have a maximum generation rate at which the ruthenium tetroxide can be formed and thus the throughput of the deposition chamber may be limited by this process. The generation process variables may be affected by the ozone gas/ruthenium solid interface surface area, the temperature of the ruthenium source, the concentration of ozone in the processing vessel 631, and the flow rate of the carrier gas delivered into the processing vessel, to name just a few. Therefore, in one aspect of the invention the controller 480 is adapted to adjust the time when to begin the ruthenium tetroxide formation process and the flow rate of the ozone containing gas into the processing vessel 631 to control the rate of ruthenium tetroxide formation and thus prevent a case where the gas delivery system cannot fill the source vessel 641 in time due to need to generate ruthenium tetroxide at a rate that exceeds the maximum ruthenium tetroxide formation rate.

Figure 6C:
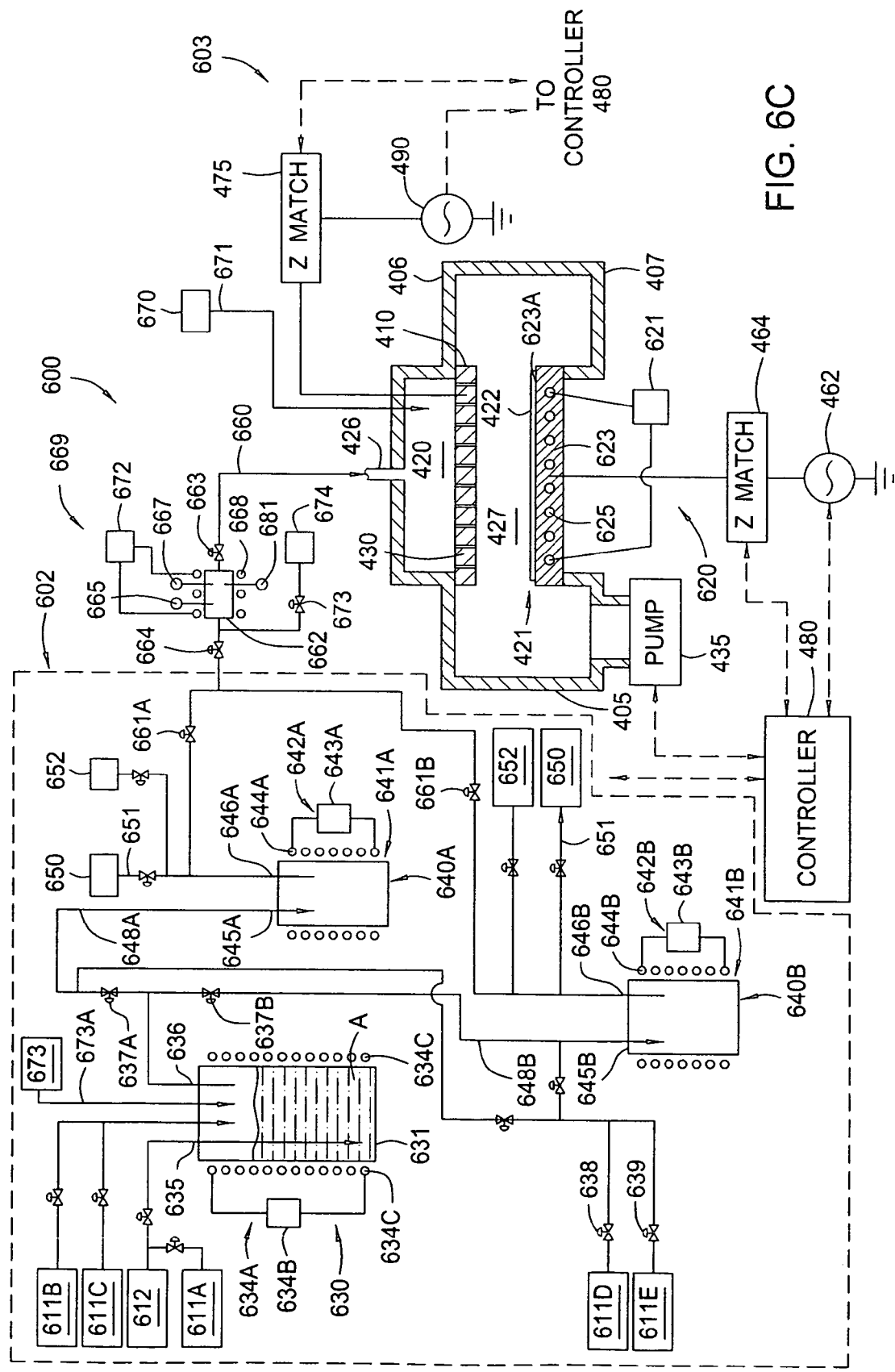

FIG. 6C illustrates one embodiment of the gas delivery system 601 similar to what is shown in FIG. 6B, except that contains a dosing vessel assembly 669 mounted in the outlet line 660 which is adapted to deliver a repeatable mass of ruthenium tetroxide gas, or volume of ruthenium tetroxide gas at a desired temperature and pressure, to the process chamber 603. The dosing vessel assembly 669 generally contains an inlet isolation valve 664, a dosing vessel 662, and an outlet isolation valve 663. In one embodiment, the dosing vessel assembly 669 also contains a temperature sensor 665, a pressure sensor 667, a heat exchanging device 668 (e.g., fluid heat exchanging device, a resistive heating device and/or a thermoelectric device, etc.) and a temperature controller 672, which are adapted to communicate with the controller 480. Generally, in this configuration the controller 480 is adapted to control and monitor the state of the ruthenium tetroxide gas retained in the dosing vessel 662.

In another embodiment, the dosing vessel assembly 669 also contains an optical sensor 681 which is adapted to sense the presence to ruthenium tetroxide and communicate with the controller 480. In one aspect, the optical sensor 681 is adapted to sense the presence of the ruthenium tetroxide containing gas in the dosing vessel 662 by measuring the change in absorption of certain wavelengths of light in the ruthenium tetroxide containing gas. In this configuration the optical sensor may be an optical prism or other conventional device that is calibrated to sense the presence of a desired concentration of ruthenium tetroxide gas in the dosing vessel 662.

FIG. 7 illustrates process 700A which is a modified version of the process 700 depicted in FIG. 5, which includes a new fill dosing vessel step 705. In this modified version of the process 700 the dosing vessel 662 is filled after performing the purge source vessel step 704 has been completed, but prior to process step 706. In one embodiment, prior to starting the process step 705 the dosing vessel is evacuated to a desired vacuum pressure by opening the outlet valve 663, while leaving the inlet valve 664 closed, thus allowing the vacuum pump 435 in the process chamber 603 to evacuate the dosing vessel 662.

Process step 705 starts when one of the source vessels 641A, or 641B, that contains an amount of condensed or solidified ruthenium tetroxide is heated to a temperature that causes the condensed or solidified ruthenium tetroxide in the source vessel 640A, or 640B, to form a ruthenium tetroxide containing gas. Once the a desired temperature has been achieve in the source vessel 640A, or 640B, the process chamber isolation valve 661A, or 661B, and the inlet isolation valve 664 are opened, while the outlet isolation valve 663 is closed, thus causing the ruthenium tetroxide gas to flow into the dosing vessel 662. Once a desired pressure and temperature of the ruthenium tetroxide gas has been achieved in the dosing vessel 662, the inlet valve 664 is closed. Thus a fixed mass, or volume at a desired temperature and pressure, is retained in the dosing vessel 662. Generally, the mass of ruthenium tetroxide retained in the dosing vessel 662 is then maintained at a desired temperature and pressure by use of the temperature sensor 665, the pressure sensor 667, the heat exchanging device 668 and the temperature controller 672 until the process step 706 is ready to be completed. In one aspect, the process step 706 is not started until a desired temperature and/or pressure is achieved in the dosing vessel 662 so that a repeatable deposition process, i.e., process step 706, can be performed on the substrate.

In process 700A, the process step 706 is modified from the process described above in conjunction with FIG. 5, due to the incorporation of dosing vessel 662 in the system. In this configuration, process 706 is completed when the gas source isolation valve 673 and the outlet valve 663 are opened, while the inlet valve 664 remains closed, thus causing the carrier gas from the inert gas source 674 to flow through the dosing vessel 662 and carry the ruthenium tetroxide containing gas into the inlet line 426, through the showerhead 410, into the evacuated process region 427 and across the temperature controlled substrate 422 so that a ruthenium containing layer can be formed on the substrate surface. In one aspect, no carrier gas is used to deliver the ruthenium tetroxide to the process region 427.

In one aspect, the inert gas source 674 and/or the dosing vessel 662 are used to "dose," or "pulse," the ruthenium tetroxide containing gas into the process region 427 so that the gas can saturate the surface of the substrate (e.g., an ALD type process). The "dose," or "dosing process," may be performed by opening and closing the various isolation valves for a desired period of time so that a desired amount of the ruthenium containing gas can be injected into the process chamber 603. In one aspect, no inert gas is delivered to the dosing vessel 662, from the gas source 674, during the dosing process.

Referring to FIG. 4, in one aspect of the invention, an ozone generator 612B is connected to the process chamber 603 and is utilized to remove the deposited ruthenium on the various chamber components during the previous deposition steps. In one aspect, a single ozone generator 612 is used to form the ruthenium tetroxide containing gas and clean the processing chamber 603.

Alternate Ruthenium Tetroxide Generation Process

Figure 9:
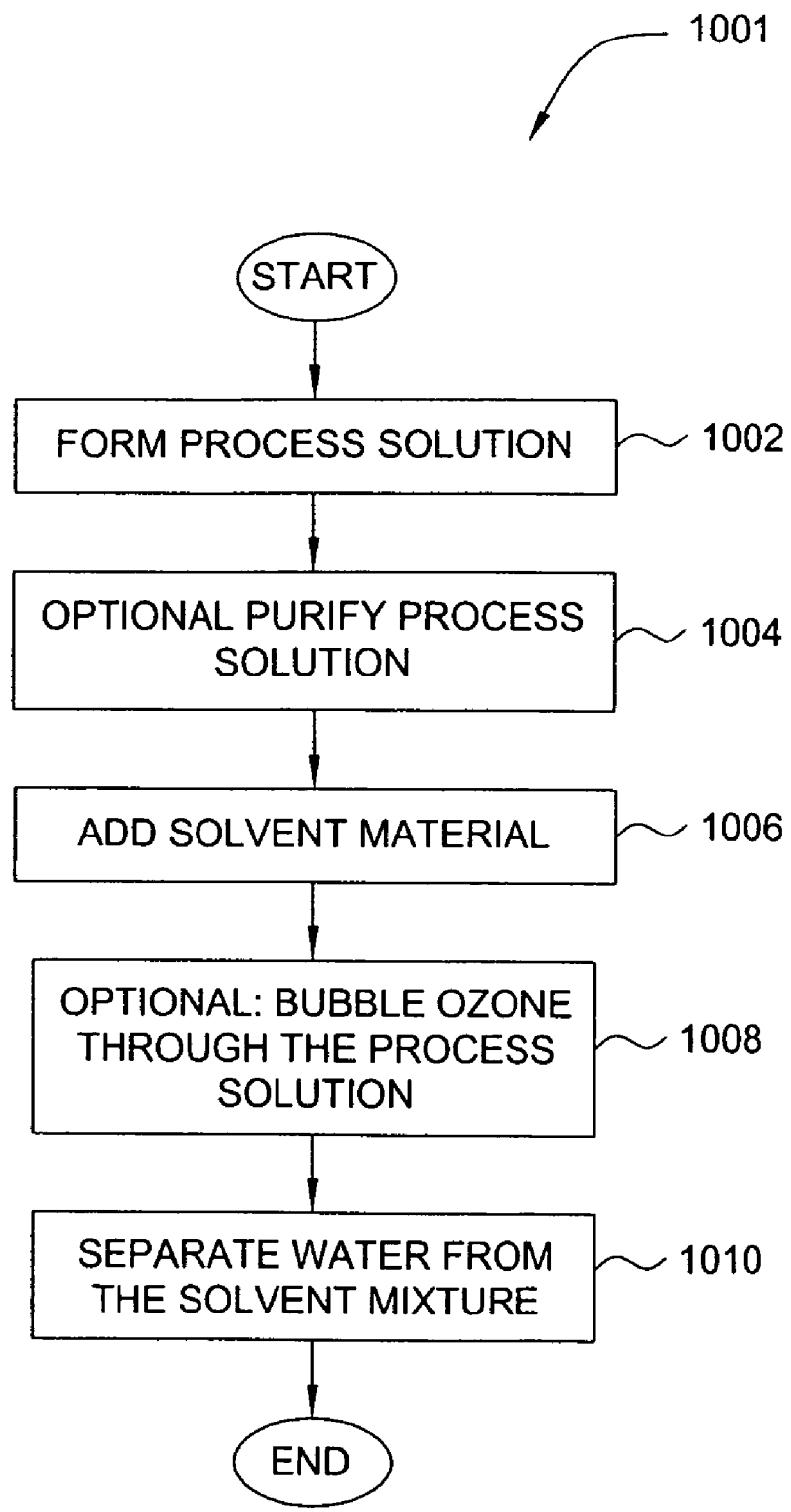
FIG. 9 illustrates another process sequence according to one embodiment described herein.

FIG. 9 illustrates one embodiment of a ruthenium tetroxide containing solvent formation process 1001 that may be used to form ruthenium tetroxide using a perruthenate containing source material. The first step of the ruthenium tetroxide containing solvent formation process 1001 (element 1002) starts by first dissolving a perruthenate material, such as sodium perruthenate in an aqueous solution in a first vessel (e.g., element 1021 in FIG. 10C). In one embodiment, the process solution may be formed by dissolving perruthenate material in a solution of excess sodium hypochlorite (NaOCl) followed by titration with sulfuric acid to a pH value near 7 to liberate ruthenium tetroxide. One will note that hypochlorite materials, such as potassium or calcium hypochlorite, may also be used in place of the sodium hypochlorite. The ruthenium tetroxide is likely formed according to reaction (4).

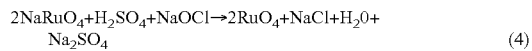

$$2NaRuO_4 + H_2SO_4 + NaOCl \rightarrow 2RuO_4 + NaCl + H_2O + Na_2SO_4 \quad (4)$$

In one example, a process solution was formed by mixing 50 ml of a sodium hypochlorite (e.g., 10% NaOCl solution) with 1 gram of finely powdered perruthenate material ruthenium metal and stirring until dissolution is essentially complete. A sufficient amount of 10% solution of $H_2SO_4$ in water was then added to achieve a pH of about 7. In general, any acid that is non-oxidizable and non-volatile can be used in place of the sulfuric acid, such as phosphoric acid ($H_3PO_4$).

In one embodiment of the ruthenium tetroxide containing solvent formation process 1001, an optional purification step 1004 may next be performed on the process solution. The step 1005 generally includes the steps: 1) warming the process solution mixture to temperature of about 50° C. in a first vessel, and 2) bubbling an inert gas or ozone ($O_3$) through the process solution to deliver the vapor generated in the first vessel to a cooled second vessel (e.g., <20° C.) where the generated vapor condenses giving a mixture of ruthenium tetroxide and water. The ruthenium tetroxide vapor generated in the first vessel will thus be collected in the pure water contained in the second vessel. It should be noted that after completion of step 1004 the second vessel will contain the aqueous solution components that the rest of the ruthenium tetroxide containing solvent formation process 1001 steps will use, while the left over components in the first vessel can be discarded or reclaimed. Step 1004 may be useful to help purify the process solution which will be used as the ruthenium tetroxide source material.

In step 1006 an amount of a solvent is added to the aqueous solution to solublize all of the ruthenium tetroxide contained in the aqueous solution. Suitable solvents generally include the materials such as perfluorocarbons ($C_xF_y$), hydrofluorocarbons ($H_xC_yF_z$), and chlorofluorocarbons (Freons or CFCs.). In general any solvent material that is non-polar, non-oxidizable and has a boiling point near and more preferably below about 50° C. may be useful to perform this process. Preferably, the boiling point of the solvent is between ca. 25° C. and 40° C. In general, while both chlorofluorocarbons and perfluorocarbons are effective, perfluorocarbons, which have been shown not to behave as ozone depleting substances (ODS), are preferred. For example, a suitable solvents may be perfluoropentane ($C_5F_{12}$), perfluorohexane ($C_6F_{14}$) or a Freon containing material, such as Freon 11 (fluorotrichloromethane ($CFCl_3$)), or Freon 113 (1,1,2-trichloro-1,2,2-trifluoroethane ($CCl_2FCClF_2$). In general, various common refrigerants may be employed as solvents, particularly if the entire process can be performed within a sealed system capable of preventing their release into the environment. Perfluoropentane may have many advantages for use in the semiconductor industry since it can easily be purchased in a pure form, it is not an "ozone depleting substance", and is extremely inert and thus will generally not react with the materials it is exposed to during processing.

In one embodiment of the ruthenium tetroxide containing solvent formation process 1001, an optional step 1008 may next be completed on the solvent mixture formed in step 1006. This step adds the action of bubbling ozone ($O_3$) through the solvent mixture contained in the first vessel (e.g., element 1021 FIG. 10C), which is maintained at a temperature preferably near room temperature to assure complete formation of ruthenium tetroxides. An example of a ruthenium generation step includes flowing 4% ozone containing gas at a rate of 500 ml/min through the mixture containing 1 gram of sodium perruthenate, 50 milliters of water and 25 g of Freon 113 until a desired amount of ruthenium tetroxide is formed.

The final step 1010 of the ruthenium tetroxide containing solvent formation process 1001 generally requires the step of separating the water from the solvent mixture formed after completing steps 1006 and/or 1008 to form an "anhydrous" solvent mixture. In one aspect, by choosing a solvent that is not miscible with water allows the water to be easily removed from the solvent mixture by use of some conventional physical separation process. Failure to separate most, if not all, of the water from the rest of the solvent mixture may cause problems in the subsequent process steps and can decrease the selectivity of the ruthenium containing layer deposition. If the selected solvent is not miscible with water and has a different density than water, such as perfluoropentane, Freon 11 or Freon 113, most of the water can be easily separated from the static mixture by use of simple mechanical techniques (e.g., a separatory funnel, siphon or pump). A complete removal of the residual water may be accomplished by contacting the liquid with a molecular sieve (e.g., 3A molecular sieves) followed by conventional filtration. In one aspect, the "anhydrous" solvent mixture can then be transferred into a vessel that may be used as an ALD or CVD precursor source for use on a processing tool in which the ruthenium containing layer is to be deposited. It is important to note that pure solid ruthenium tetroxide is generally unstable which makes it difficult to handle and hard to transport from one place to another. Therefore, one benefit of the invention described herein is it creates a way to effectively transport and/or generate pure ruthenium tetroxide that can be used to form a ruthenium containing layer. In one aspect, it may be desirable to ship and place the ruthenium tetroxide in an environment that has no exposure to light to prevent decomposition of the ruthenium tetroxide to ruthenium dioxide and oxygen.

In one embodiment, it may be important to assure that all of the contaminants are removed from the "anhydrous" solvent mixture to prevent or minimize contamination of the substrate surface during a subsequent ruthenium containing layer deposition process steps. In one aspect, to assure that all or most of the contaminants are removed, various purification processes may be completed on the "anhydrous" solvent mixture before the mixture or its components are ready to be exposed to a substrate surface. In one aspect, the purification process may include completing the process step 1004 on the process solution formed in step 1002 at least once. In another aspect, the process step 1010 in the ruthenium tetroxide containing solvent formation process 1001 is completed on the process solution at least once.

Figure 10A:
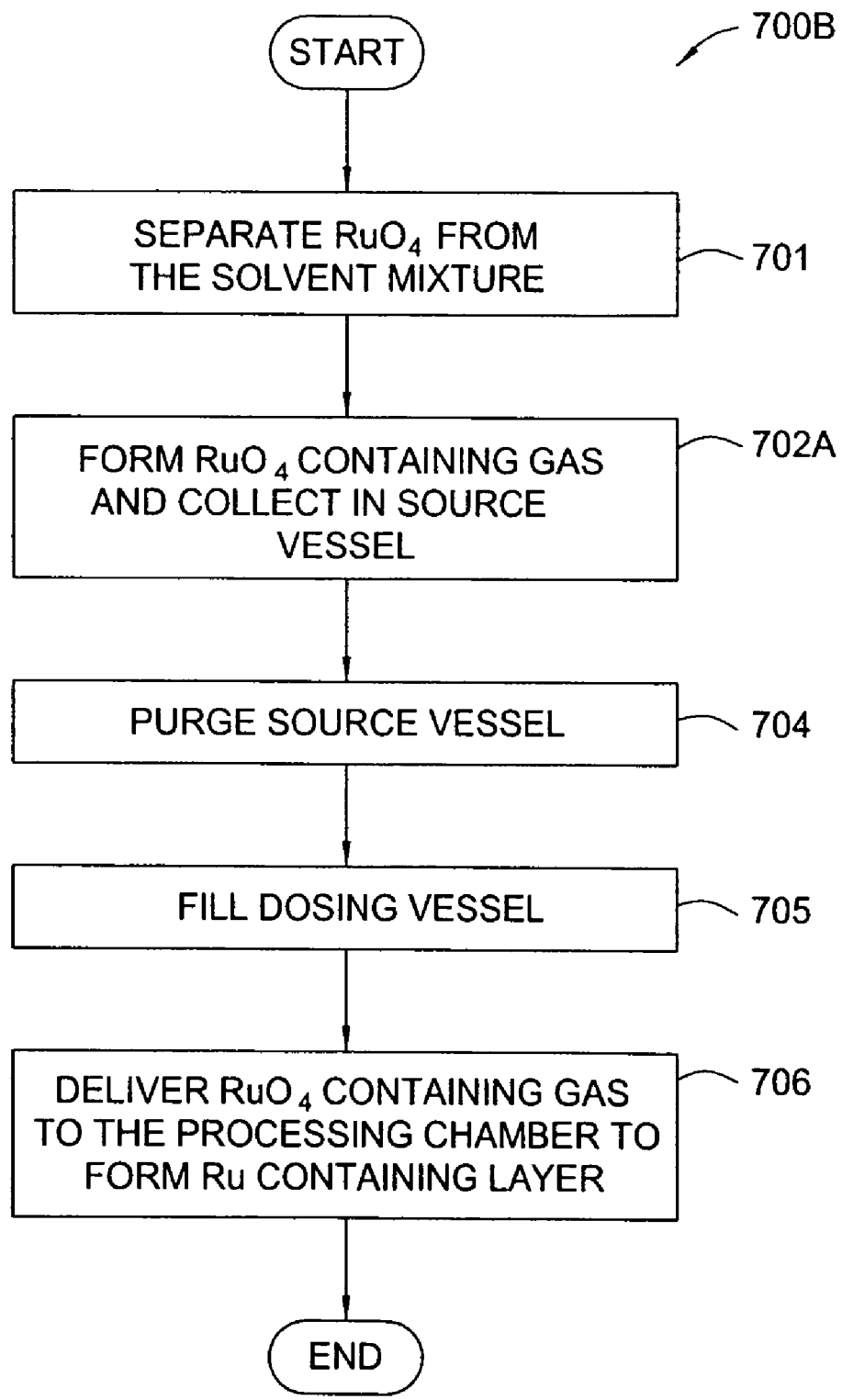
FIG. 10A illustrates another process sequence according to one embodiment described herein.

Ruthenium Containing Layer Deposition Process Using a Ruthenium Tetroxide Containing Solvent After performing the ruthenium tetroxide containing solvent formation process 1001 the "anhydrous" solvent mixture is then used to form a ruthenium containing layer on a surface of the substrate by use of another embodiment of the process 700 (hereafter process 700B) illustrated in FIG. 10A. In this embodiment, the process 700B contains a new process step 701, a refined version of process step 702 (i.e., step 702A in FIG. 10C) and the process steps 704-706 described above. In other embodiments, the steps found in process 700B may be rearranged, altered, one or more steps may be removed, or two or more steps may be combined into a single step without varying from the basic scope of the invention. For example, in one embodiment, the process step 705 is removed from the process 700B.

Figure 10B:
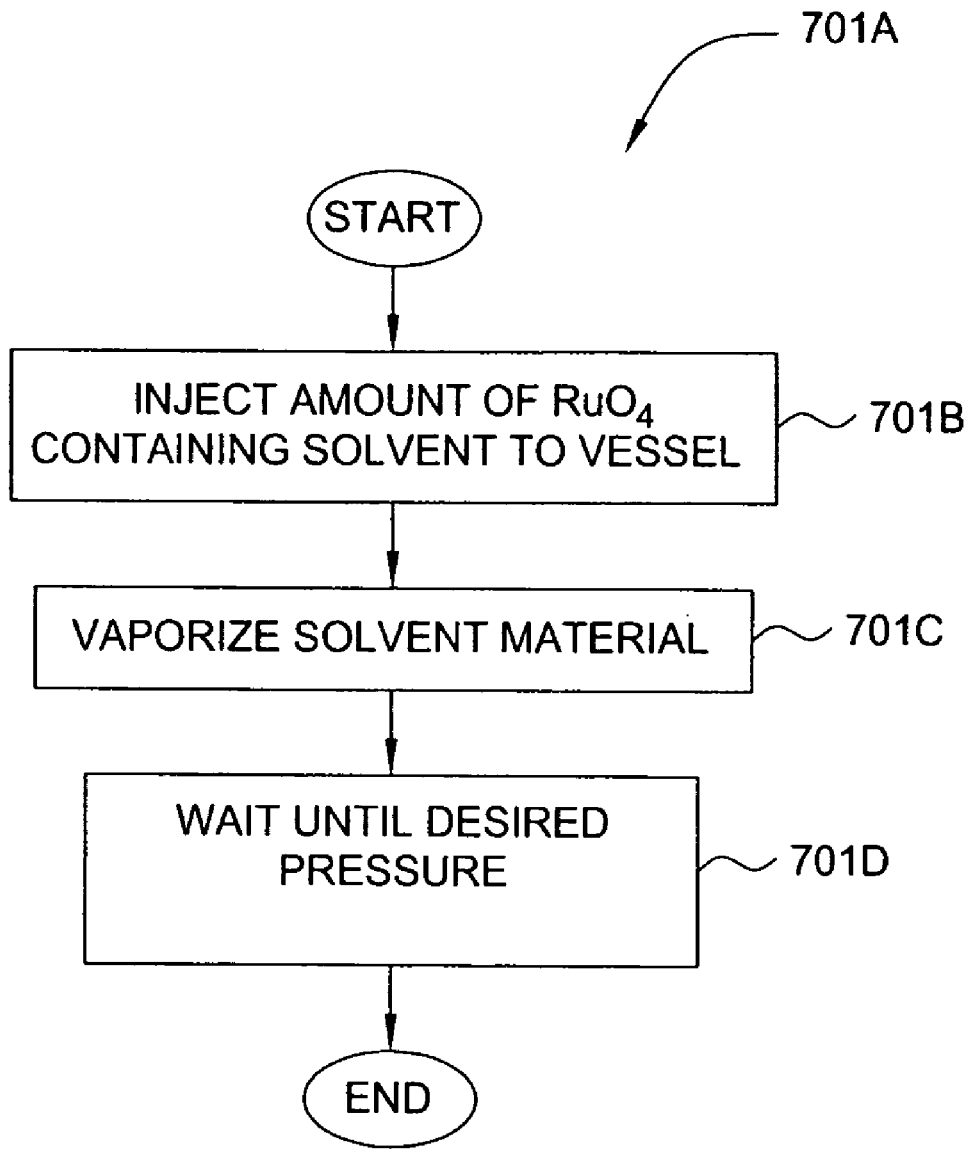
FIG. 10B illustrates another process sequence according to one embodiment described herein.
Figure 10C:
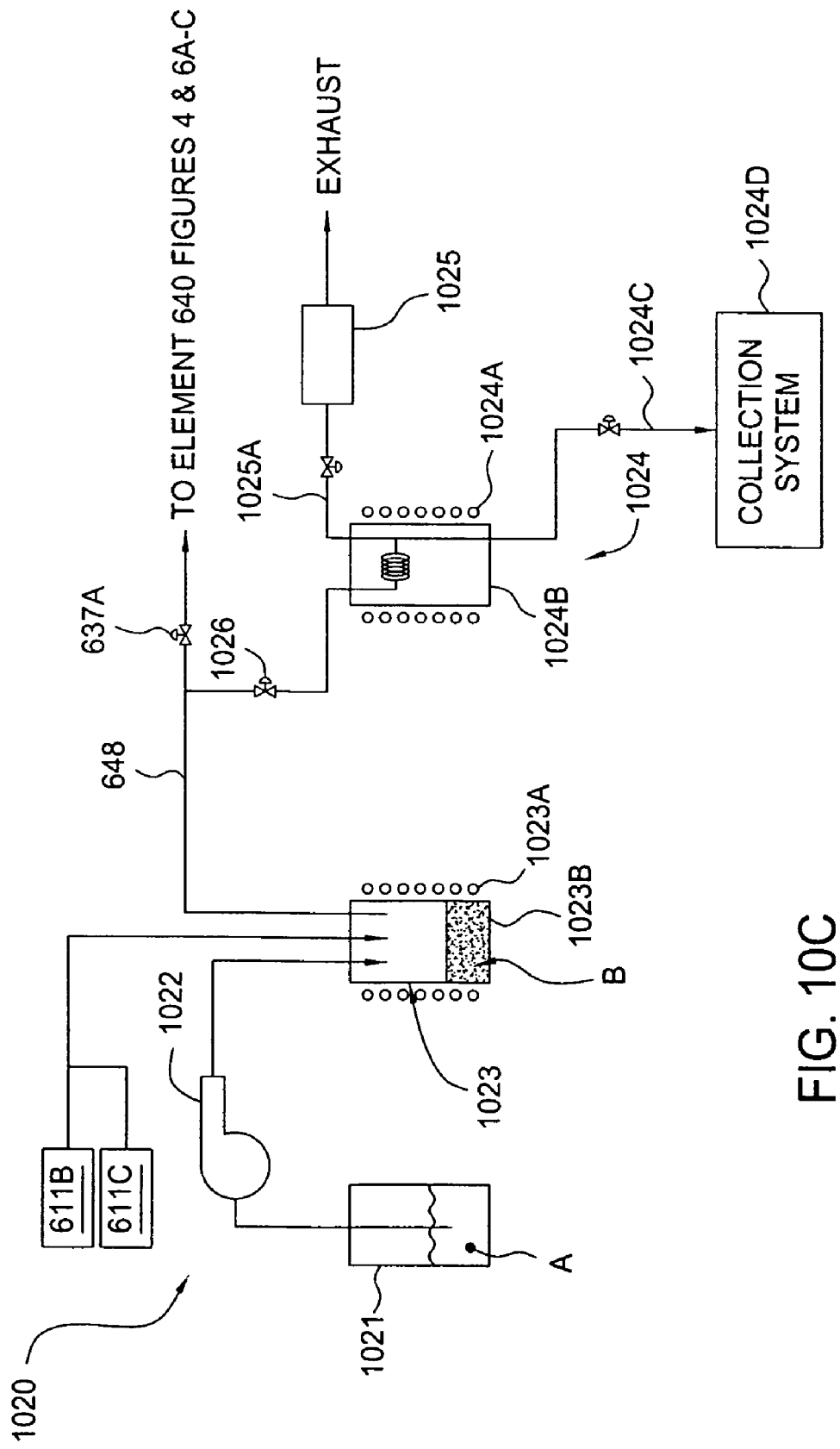
FIG. 10C illustrates a cross-sectional view of a process vessel that may be adapted to perform an embodiment described herein.

The first step of process 700B, or step 701, requires the separation of the ruthenium tetroxide from the rest of the "anhydrous" solvent mixture. In one embodiment, step 701 is a series of process steps (see process sequence 701A in FIG. 10B) that may utilize a separation hardware system 1020 (see FIG. 10C) to separate the ruthenium tetroxide from the rest of the "anhydrous" solvent mixture. FIG. 10B illustrates one embodiment of a process sequence 701A that may be used to perform process step 701. The process sequence 701A starts by delivering and connecting a first vessel 1021 that contains the "anhydrous" solvent mixture (element "A") formed using the ruthenium tetroxide containing solvent formation process 1001 to a processing vessel assembly 1023. The hardware shown in FIG. 10C is intended to be a direct replacement for the processing vessels 630, 630A and 630B shown in FIGS. 4 and 6A-C, which can deliver a ruthenium tetroxide containing gas to the source vessel assembly (see element 640 in FIG. 4 and elements 640A or 640B in FIGS. 6A-C) and eventually the processing chamber 603 (see FIGS. 4 and 6A-C). Similar or like element numbers found in FIGS. 4 and 6A-C are used in FIG. 10C for clarity. The processing vessel assembly 1023 generally contains a processing vessel 1023B and temperature controlling device 1023A (e.g., fluid heat exchanging device, a resistive heating device and/or a thermoelectric device).

The first step (step 701B) of the process sequence 701A starts by injecting a desired amount of the "anhydrous" solvent mixture, into a processing vessel 1023B by use of a metering pump 1022 or other conventional fluid delivery process. The processing vessel 1023B is then evacuated to a desired temperature and pressure (step 701C) by use of a heat exchanging device 1023A, a vacuum pump 1025 and/or one or more gas sources 611B-C so that the solvent, which has a higher vapor pressure than the ruthenium tetroxide, will vaporize and thus become separated from the ruthenium tetroxide material that is retained in the processing vessel 1023B (element "B" FIG. 10C). For example, if Freon 113 is used as the solvent material, temperatures of less than about 0° C. and pressures of about 360 Torr can be used to separate the solidified ruthenium tetroxide from the solvent mixture. Low pressures, such as about 3 Torr, may be used to perform the separation process, but a larger amount ruthenium tetroxide will be carried away with the solvent, and thus lost, as the pressure used to complete this step is lowered.

The last step of the process sequence 701A, step 701D, generally requires that the processing vessel 1023B be evacuated until the pressure in the processing vessel reaches a desired level or until the pressure in the vessel stabilizes. In general, step 701D is performed until only small amounts of solvent, left over water and/or other solubilized foreign materials are left in the processing vessel 1023B. Failure to adequately separate the other materials from the ruthenium tetroxide material may cause contamination of the ruthenium containing layer formed during subsequent deposition process(es) (e.g., step 706 of FIGS. 5 and 7). In one aspect, it may be advantageous to control the temperature in the processing vessel 1023B to cause the solvent and other materials to be removed.

In one aspect of the process sequence 701A, a cold trap assembly 1024 is used to collect and reclaim the vaporized solvent material created as the processing vessel 1023B is evacuated by the vacuum pump 1025. The cold trap assembly 1024 is adapted to cool a portion of the vacuum line 1025A to a temperature that will cause the vaporized solvent material to condense so that in a subsequent step the condensed solvent can be reclaimed in a collection tank/system 1024D. The cold trap assembly 1024 generally contains a collection region 1024B of chilled vacuum line 1025A, an isolation valve 1026, a temperature controlling device 1024A (e.g., fluid heat exchanging device, a resistive heating device and/or a thermoelectric device) and a collection line 1024C connected to a solvent collection tank/system 1024D. In one aspect, any collected ruthenium tetroxide found in the condensed solvent is reclaimed.

After performing step 701 the separated ruthenium tetroxide, which is contained in processing vessel 1023B, can then be used to form a ruthenium containing layer on a surface of the substrate by use of a refined version of process step 702 (step 702A in FIG. 10A) and the process steps 704-706 described above. The refined process step 702A requires controlling the temperature of the ruthenium tetroxide material contained in the processing vessel 1023B and the pressure inside the processing vessel 1023B to cause the leftover solid ruthenium tetroxide to vaporize, so that it can be collected in a source vessel assembly (e.g., elements 640, 640A or 640B in FIGS. 4 and 6A-C), similar to the aspects discussed in process step 702 above. The term vaporize as used herein is intended to describe the process of causing a material to be converted from a solid or liquid to a vapor. In one example, the ruthenium tetroxide material is maintained at a temperature of about 25° C. and 2 Torr to cause the vaporization process to occur so that vaporized material can be delivered and collected in the source vessel(s). Referring to FIG. 10C, in one aspect, the vaporized ruthenium tetroxide is carried by a flowing process gas delivered from the one or more gas sources 611B-C through the processing vessel 1023B, a process line (e.g., 648, 648A or 648B) and valve 637A to the source vessel(s) (not shown). The concentration and flow rate of the ruthenium tetroxide containing gas is related to the process gas flow rate and the vaporization rate of the ruthenium tetraoxide in the processing vessel 1023B. The vaporization rate is related to the equilibrium partial pressure of ruthenium tetroxide at the pressure and temperature maintained in the processing vessel 1023B. After performing step 702A a ruthenium containing layer can be deposited on a substrate surface by following the process steps 704 -706 as described above. In one embodiment, multiple sequential doses of ruthenium tetroxide are delivered to the process chamber 603 to form a multilayer ruthenium containing film. To perform the multiple sequential doses at least one of the process steps 701 through 706, described in conjunction with FIG. 10A, are repeated multiple times to form the multilayer ruthenium containing film. In another embodiment, a continuous flow of a desired concentration of a ruthenium tetroxide containing gas is delivered across the surface of the substrate during the ruthenium containing layer deposition process.

Figure 11:
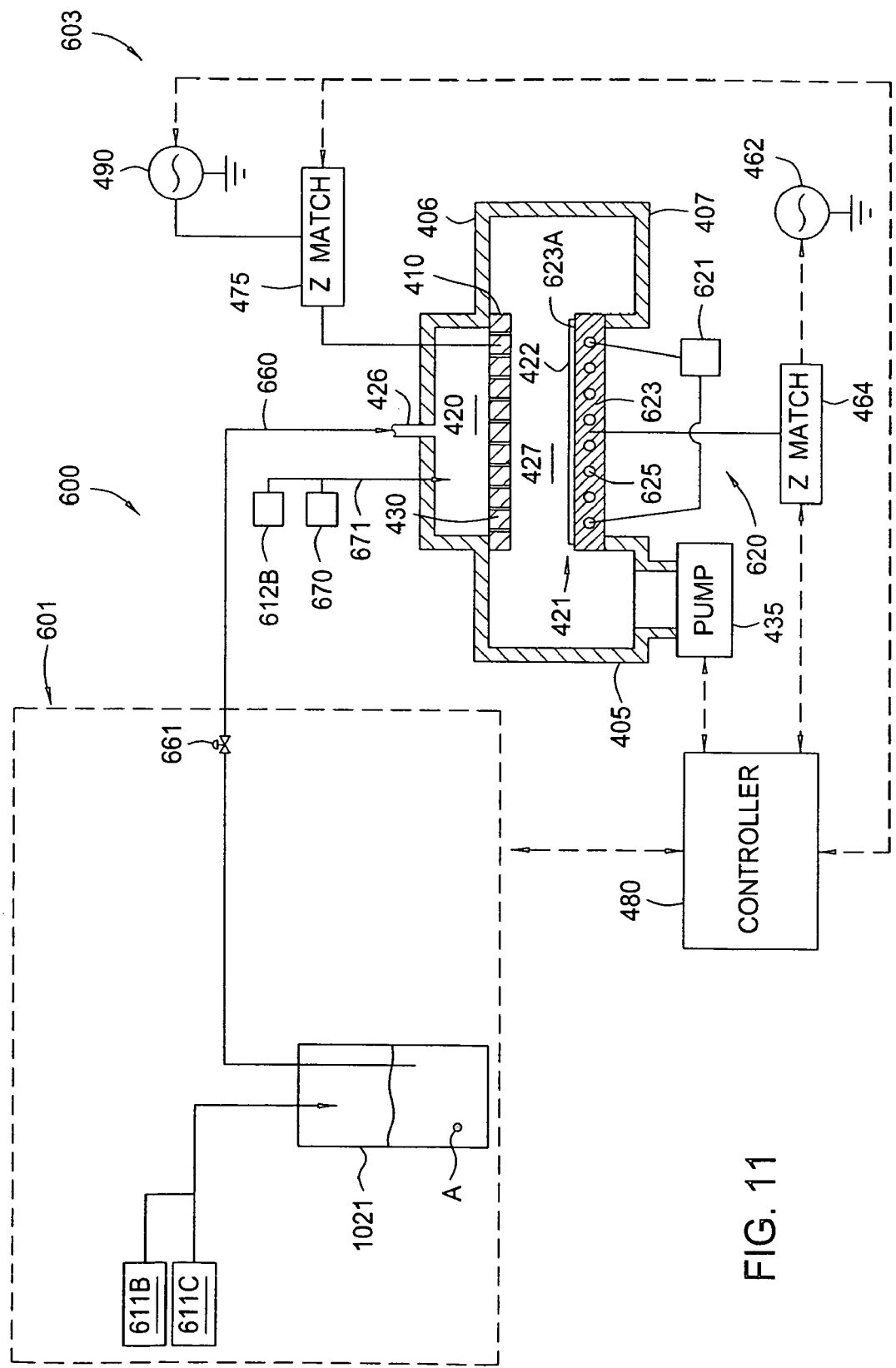
FIG. 11 illustrates a cross-sectional view of a deposition chamber that may be adapted to perform an embodiment described herein.

Ruthenium Containing Layer Deposition Process Using the Anhydrous Solvent Mixture In one embodiment of a process of forming a ruthenium containing layer on a surface of a substrate, the "anhydrous" solvent mixture formed in the ruthenium tetroxide containing solvent formation process 1001 is directly delivered to a surface of a substrate positioned in the processing chamber 603 (see FIG. 11). In one aspect, an inert solvent, such as perfluoropentane ($C_5F_{12}$), which will generally not interact with the materials on the substrate surface at temperatures below its decomposition temperature, is used to prevent contamination of the substrate surface during the ruthenium containing layer deposition process.

Referring to FIG. 11, in this embodiment, a ruthenium containing layer is formed on a surface of a heated substrate by delivering the "anhydrous" solvent mixture to the substrate positioned in the process region 427 of the processing chamber 603. The heated substrate may be at a temperature below about 350° C., and more preferably at a temperature below about 300° C. Selection of the process temperature can be important to prevent the decomposition of the solvent material. Typically, the processing chamber pressure is maintained at a process pressure below about 10 Torr to complete the ruthenium containing layer deposition process.

Referring to FIG. 11, in one embodiment, a desired amount, or mass, of the purified solvent mixture (element "A") is delivered to the process region 427 by use of a carrier gas delivered from the gas source 611D and a hydrogen ($H_2$) containing gas (e.g., hydrogen ($H_2$)) to form a ruthenium layer on the surface of the substrate. In one aspect, in place of hydrogen, the reducing co-reactant may be hydrazine ($N_2H_4$) which is entrained in an inert carrier gas such as $N_2$. In one aspect, the carrier gas is delivered from the gas source 611E through a first vessel 1021, which contains the "anhydrous" solvent mixture and then directly through outlet line 660 and to a substrate 422 positioned in the process region 427 of the process chamber 603. In another embodiment, multiple sequential doses of the "anhydrous" solvent mixture are delivered to the process chamber 603 to form a multilayer ruthenium containing film. To perform the multiple sequential doses, a desired amount of the "anhydrous" solvent mixture is sequentially delivered to the substrate multiple times to form the multilayer ruthenium containing film. The desired mass of ruthenium tetroxide that needs to be delivered to the process region 427 to form a ruthenium containing layer is generally dependent on the amount of ruthenium tetroxide that is required to completely saturate the substrate surface and other chamber components. Therefore, the amount of the "anhydrous" solvent mixture that needs to be delivered to the process chamber 603 is dependent on the desired mass of ruthenium tetroxide and the concentration of the ruthenium tetroxide in the "anhydrous" solvent mixture.

In another embodiment, a continuous flow of the "anhydrous" solvent mixture is adapted to flow across the surface of the substrate 422 during the ruthenium containing layer deposition process. In one aspect, the "anhydrous" solvent mixture flows past the surface of the substrate and is collected by the vacuum pump 435. In one aspect, a cold trap assembly 1024 (FIG. 10C) and collection tank/system 1024D (FIG. 10C) are in fluid communication with the process region 427 and the vacuum pump 435 to collect any leftover "anhydrous" solvent mixture components, such as the solvent and any unreacted ruthenium tetroxide.

Cluster Tool Configuration(s)

Figure 8:
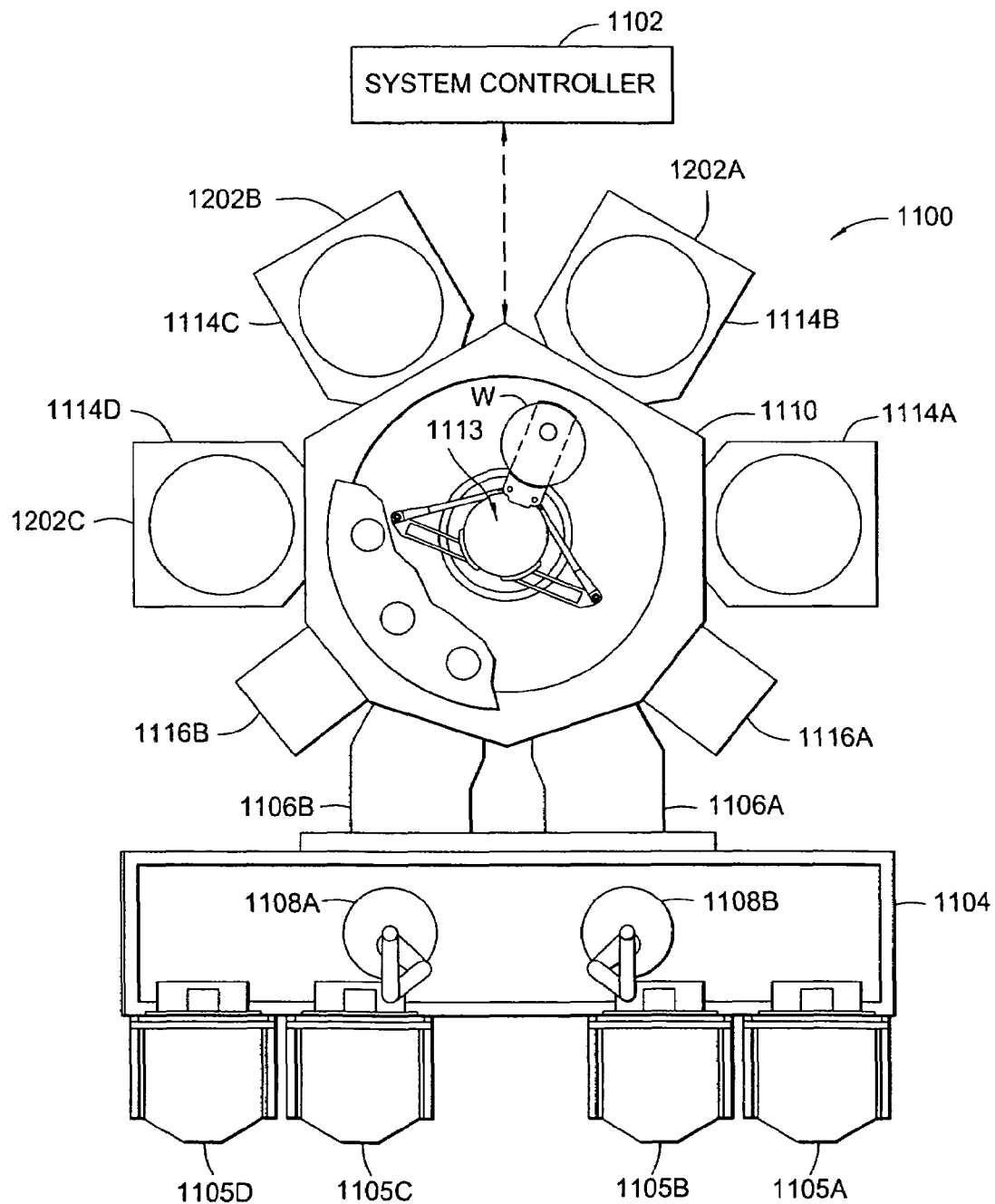
FIG. 8 is a plan view of a cluster tool used for semiconductor processing wherein the present invention may be used to advantage.

FIG. 8 is a plan view of a cluster tool 1100 that is useful for electronic device processing wherein the present invention may be used to advantage. Two such platforms are the Centura RTM and the Endura RTM both available from Applied Materials, Inc., of Santa Clara, Calif. FIG. 8 illustrates a plan view of a Centura RTM cluster tool. The details of one such staged-vacuum substrate processing system are disclosed in U.S. Pat. No. 5,186,718, entitled "Staged-Vacuum Substrate Processing System and Method," Tepman et al., issued on Feb. 16, 1993, which is incorporated herein by reference. The exact arrangement and combination of chambers may be altered for purposes of performing specific steps of a fabrication process.

In accordance with aspects of the present invention, the cluster tool 1100 generally comprises a plurality of chambers and robots and is preferably equipped with a system controller 1102 programmed to control and carry out the various processing methods and sequences performed in the cluster tool 1100. FIG. 8 illustrates one embodiment, in which a processing chamber 603 is mounted in position 1114A on the transfer chamber 1110 and three substrate processing chambers 1202A-C are mounted in positions 1114B-D on the transfer chamber 1110. The processing chamber 603 may placed in one or more of the other positions, for example positions 1114B-D, to improve hardware integration aspects of the design of the system or to improve substrate throughput. In some embodiments, not all of the positions 1114A-D are occupied to reduce cost or complexity of the system.

Referring to FIG. 8, an optional front-end environment 1104 (also referred to herein as a Factory Interface or FI) is shown positioned in selective communication with a pair of load lock chambers 1106. Factory interface robots 1108A-B disposed in the front-end environment 1104 are capable of linear, rotational, and vertical movement to shuttle substrates between the load locks 1106 and a plurality of substrate containing pods (elements 1105A-D) which are mounted on the front-end environment 1104.

The load locks 1106A-1106B provide a first vacuum interface between the front-end environment 1104 and a transfer chamber 1110. In one embodiment, two load locks 1106 are provided to increase throughput by alternatively communicating with the transfer chamber 1110 and the front-end environment 1104. Thus, while one load lock communicates with the transfer chamber 1110, a second load lock can communicate with the front-end environment 1104. In one embodiment, the load locks (elements 1106A-1106B) are a batch type load lock that can receive two or more substrates from the factory interface, retain the substrates while the chamber is sealed and then evacuated to a low enough vacuum level to transfer of the substrates to the transfer chamber 1110.

A robot 1113 is centrally disposed in the transfer chamber 1110 to transfer substrates from the load locks to one of the various processing chambers mounted in positions 1114A-D and service chambers 1116A-B. The robot 1113 is adapted to transfer the substrate "W" to the various processing chambers by use of commands sent from the system controller 1102. A robot assembly used in a cluster tool that may be adapted to benefit from the invention are described in commonly assigned U.S. Pat. No. 5,469,035, entitled "Two-axis magnetically coupled robot", filed on Aug. 30, 1994; U.S. Pat. No. 5,447,409, entitled "Robot Assembly" filed on Apr. 11, 1994; and U.S. Pat. No. 6,379,095, entitled Robot For Handling Semiconductor Substrates", filed on Apr. 14, 2000, which are hereby incorporated by reference in their entireties.

The processing chambers 1202A-C mounted in one of the positions 1114A-D may perform any number of processes such as preclean (e.g., selective or non-selective dry etch of the substrate surface), PVD, CVD, ALD, Decoupled Plasma Nitridation (DPN), rapid thermal processing (RTP), metrology techniques (e.g., particle measurement, etc.) and etching while the service chambers 1116A-B are adapted for degassing, orientation, cool down and the like. In one embodiment, as discussed above in conjunction with FIG. 1A the processing sequence is adapted to deposit a barrier layer on the surface of the substrate using an ALD type process and then deposit a ruthenium containing layer in a separate chamber. In this embodiment, the cluster tool 1110 may be configured such that processing chamber 1202A is a Endura iCuB/S™ chamber, which is available from Applied Materials Inc., and the processing chamber 603 is mounted in position 1114A. In one embodiment a preclean chamber is added to the process sequence prior to the barrier deposition process (element 102 of FIG. 1A) and is mounted in position 1202B of the cluster tool 1110.

In one aspect of the invention, one or more of the processing chambers 1202A-C may be an RTP chamber which can be used to anneal the substrate before or after performing the batch deposition step. An RTP process may be conducted using an RTP chamber and related process hardware commercially available from Applied Materials Inc. located in Santa Clara, Calif. In another aspect of the invention, one or more of the single substrate processing chambers 1202A-C may be a CVD chamber. Examples of such CVD process chambers include DXZ™ chambers, Ultima HDP-CVD™ and PRECISION 5000® chambers, commercially available from Applied Materials, Inc., Santa Clara, Calif. In another aspect of the invention, one or more of the single substrate processing chambers 1202A-C may be a PVD chamber. Examples of such PVD process chambers include Endura™ PVD processing chambers, commercially available from Applied Materials, Inc., Santa Clara, Calif. In another aspect of the invention, one or more of the single substrate processing chambers 1202A-C may be a DPN chamber. Examples of such DPN process chambers include DPN Centura™, commercially available from Applied Materials, Inc., Santa Clara, Calif. In another aspect of the invention, one or more of the single substrate processing chambers 1202A-C may be a process/substrate metrology chamber. The processes completed in a process/substrate metrology chamber can include, but are not limited to particle measurement techniques, residual gas analysis techniques, XRF techniques, and techniques used to measure film thickness and/or film composition, such as, ellipsometry techniques.

Ruthenium Dioxide Bottom Up Fill Process

In one aspect of the invention, the ruthenium containing layer deposited in process step 104 in FIG. 1A and step 304 in FIG. 1B is deposited on a substrate surface maintained at a temperature so that a ruthenium oxide layer is formed of one or all surface of the substrate. Thereafter, the ruthenium oxide layer can be reduced to form a metallic ruthenium layer by heating the substrate and exposing the surface to a reducing gas (e.g., hydrogen containing gas), exposing the surface of the substrate to an electroless or electroplating solution which will reduce the exposed surfaces, or by liberating the oxygen from the layer by increasing the temperature of the substrate. In one aspect, by exposing a ruthenium tetroxide containing gas to a substrate that is at a temperature below 250° C. a ruthenium layer will selectively formed in which metallic ruthenium is formed on exposed metal surfaces and a ruthenium oxide layer on all other non-metallic materials such as dielectric materials silicon dioxide. This aspect may be especially important when using subsequent selective deposition processes, such as an electroless deposition process. This may be useful for selectively forming an electroless layer of an exposed tungsten plug (e.g., metal 2 layer) after patterning but before other deposition processes are performed.

While the foregoing is directed to embodiments of the present invention, other and further embodiments of the invention may be devised without departing from the basic scope thereof, and the scope thereof is determined by the claims that follow.

The invention claimed is:

1. A method of forming a ruthenium containing layer on a substrate surface, comprising:
   forming a ruthenium tetroxide in a first vessel;
   delivering an amount of the ruthenium tetroxide contained in the first vessel to a second vessel;
   purging the second vessel to remove unwanted contaminants after the amount of the ruthenium tetroxide has been delivered to the second vessel from the first vessel; and
   delivering an amount of ruthenium tetroxide contained in the second vessel to a substrate positioned on a substrate support in a vacuum processing chamber after purging the second vessel for a period of time, wherein the second vessel has a surface that is maintained at a temperature below about 25° C. when the amount of ruthenium tetroxide is delivered.

2. A method of claim 1, wherein forming a ruthenium tetroxide in the first vessel comprises:
   forming an ozone containing gas; and
   delivering the ozone containing gas to a surface of a ruthenium containing material positioned in the first vessel.

3. A method of claim 2, wherein the ruthenium containing material is a material selected from the group consisting of sodium perruthenate and potassium perruthenate.

4. A method of claim 1, wherein delivering the amount of ruthenium tetroxide comprises flowing a first gas that comprises ruthenium tetroxide and oxygen or ozone to the second vessel, and purging the second vessel until the oxygen or ozone concentration is reduced to less than about 100 ppm.

5. A method of claim 1, wherein the substrate support is maintained at a temperature below about 350° C.

6. A method of forming a ruthenium containing layer on a substrate surface, comprising:
   forming a ruthenium tetroxide containing gas in a first vessel;
   delivering an amount of the ruthenium tetroxide containing gas from the first vessel to a second vessel;

collecting a desired amount of ruthenium tetroxide from the ruthenium tetroxide containing gas on a surface of the second vessel that is maintained at a first temperature;

purging the second vessel to remove unwanted contaminants contained in the second vessel;

vaporizing an amount of the ruthenium tetroxide found on the surface of the second vessel; and delivering an amount of the vaporized ruthenium tetroxide from the second vessel to a substrate positioned on a substrate support in a processing chamber to form a ruthenium containing layer on a surface of the substrate.

7. A method of claim 6, wherein the first temperature of the surface is between about −20° C. and about 25° C.

8. A method of claim 6, wherein the vaporizing comprises:
heating the surface of the second vessel to a second temperature between about 0° C. and about 25° C.

9. A method of claim 6, wherein the processing chamber is a vacuum processing chamber that is adapted to process a substrate at a processing pressure between about 0.1 mTorr and about 50 Torr.

10. A method of forming a ruthenium containing layer on a substrate surface, comprising:
providing a solvent mixture that comprises a solvent and ruthenium tetroxide, wherein the solvent is selected from the group consisting of perfluorocarbons, hydroflurocarbons and chlorofluorocarbons; and
delivering the solvent mixture to a substrate positioned on a substrate support in a processing chamber.

11. A method of claim 10, wherein the solvent mixture is a perfluorocarbon, a hydroflurocarbon or a chlorofluorocarbon that is selected from the group consisting of perfluoropentane, perfluorohexane, fluorotrichloromethane and 1,1,2-trichloro-1,2,2-trifluoroethane.

12. A method of claim 10, wherein the substrate support is maintained at a temperature below about 350° C.

13. A method of forming a ruthenium containing layer on a substrate surface, comprising:
providing an aqueous solution that comprises a perruthenate material, water and a hypochlorite containing material;
adding an amount of an acid to the aqueous solution
adding a solvent to the aqueous solution to form a solvent containing mixture, wherein the solvent is selected from the group consisting of perfluorocarbons, hydroflurocarbons and chlorofluorocarbons;
removing the water from the solvent containing mixture;
separating the ruthenium tetroxide from the solvent containing mixture; and
delivering the ruthenium tetroxide to a substrate positioned on a substrate support in a processing chamber.

14. A method of claim 13, wherein the solvent mixture is a perfluorocarbon, a hydroflurocarbon or a chlorofluorocarbon that is selected from the group consisting of perfluoropentane, perfluorohexane, fluorotrichloromethane and 1,1,2-trichloro-1,2,2-trifluoroethane.

15. A method of claim 13, wherein the substrate support is maintained at a temperature between about 20° C. and about 350° C.

16. A method of claim 13, wherein delivering the ruthenium tetroxide to the substrate comprises:
delivering an amount of the ruthenium tetroxide that has been separated from the solvent containing mixture to a vessel;
purging the vessel after the amount of the ruthenium tetroxide has been received in the vessel; and
delivering an amount of the ruthenium tetroxide to the substrate after purging the vessel for a period of time.

17. A method of forming a ruthenium containing layer on a substrate surface, comprising:
forming a ruthenium tetroxide containing mixture that comprises ruthenium tetroxide and a solvent;
collecting the ruthenium tetroxide containing mixture in a first vessel that is located at a first location;
transporting the first vessel to a second location, wherein the first vessel has the ruthenium tetroxide containing mixture disposed therein;
connecting the first vessel to a processing chamber after transporting the first vessel;
separating the ruthenium tetroxide from the solvent; and
removing unwanted contaminants from the ruthenium tetroxide that has been separated from the solvent, wherein removing unwanted contaminants from the ruthenium tetroxide is performed before delivering an amount of the ruthenium tetroxide to a substrate positioned on a substrate support in the processing chamber, wherein the solvent is selected from the group consisting of perfluorocarbons, hydroflurocarbons and chlorofluorocarbons.

18. The method of claim 17, wherein the solvent has a boiling point of less than about 50° C.

19. The method of claim 17, wherein separating the ruthenium tetroxide from the solvent comprises:
evacuating a region in which the ruthenium tetroxide containing mixture is disposed by use of a pump; and
exposing the ruthenium tetroxide containing mixture to a pressure below atmospheric pressure for a period of time to remove at least a portion of the solvent.

20. The method of claim 19, further comprising cooling at least a portion of the ruthenium tetroxide containing mixture to a temperature less than about 20° C.

21. The method of claim 17, wherein removing the unwanted contaminants from the ruthenium tetroxide that has been separated from the solvent, comprises:
delivering an amount of the ruthenium tetroxide to a second vessel; and
purging the second vessel after the amount of the ruthenium tetroxide has been delivered to the second vessel.

* * * * *

UNITED STATES PATENT AND TRADEMARK OFFICE
CERTIFICATE OF CORRECTION

PATENT NO. : 7,438,949 B2
APPLICATION NO. : 11/228649
DATED : October 21, 2008
INVENTOR(S) : Weidman It is certified that error appears in the above-identified patent and that said Letters Patent is hereby corrected as shown below:

Title Page
In the References Cited (56):

Please delete "6,787,450 B2 9/2004 Morgan et al." and insert --6,787,450 B2 9/2004 Sinha et al.-- therefor;

In the Detailed Description:

Column 19, Line 44, please delete "hypochiorite" and insert --hypochlorite-- therefor;

Column 19, Line 45, please delete "ruthenium";

Column 19, Line 46, please delete "metal".

Signed and Sealed this

Tenth Day of February, 2009

JOHN DOLL
*Acting Director of the United States Patent and Trademark Office*